United States Patent
Hashimoto et al.

(10) Patent No.: US 9,187,243 B2
(45) Date of Patent: Nov. 17, 2015

(54) PLATE-SHAPED MEMBER TRANSFER FACILITY

(75) Inventors: Yasuhiko Hashimoto, Kobe (JP); Shigeki Ono, Kobe (JP); Kenji Bando, Kobe (JP)

(73) Assignee: KAWASAKI JUKOGYO KABUSHIKI KAISHA, Kobe-Shi (JP)

( * ) Notice: Subject to any disclaimer, the term of this patent is extended or adjusted under 35 U.S.C. 154(b) by 171 days.

(21) Appl. No.: 13/816,029

(22) PCT Filed: Aug. 25, 2011

(86) PCT No.: PCT/JP2011/004740
§ 371 (c)(1),
(2), (4) Date: Apr. 16, 2013

(87) PCT Pub. No.: WO2012/026129
PCT Pub. Date: Mar. 1, 2012

(65) Prior Publication Data
US 2013/0202394 A1    Aug. 8, 2013

(30) Foreign Application Priority Data
Aug. 27, 2010 (JP) .................................. 2010-190667

(51) Int. Cl.
*B65G 1/04* (2006.01)
*B65G 49/06* (2006.01)
(Continued)

(52) U.S. Cl.
CPC ................ *B65G 1/04* (2013.01); *B65G 49/061* (2013.01); *B65G 49/063* (2013.01); *B65G 49/067* (2013.01); *B65G 49/068* (2013.01); *H01L 21/6734* (2013.01); *H01L 21/67718* (2013.01);
(Continued)

(58) Field of Classification Search
CPC .. B65G 49/061; B65G 49/063; B65G 49/067; B65G 49/068; B65G 1/04
USPC .......................................... 414/277, 268, 269
See application file for complete search history.

(56) References Cited

U.S. PATENT DOCUMENTS

| | | | |
|---|---|---|---|
| 6,077,018 A * | 6/2000 | Lisec | 414/269 |
| 6,648,572 B2 * | 11/2003 | Piazza | 414/276 |
| 7,878,754 B2 * | 2/2011 | Mercure | 414/801 |

(Continued)

FOREIGN PATENT DOCUMENTS

| | | |
|---|---|---|
| CN | 2885790 Y | 4/2007 |
| JP | U-2-105906 | 8/1990 |

(Continued)

OTHER PUBLICATIONS

Sep. 27, 2011 International Search Report issued in International Patent Application No. PCT/JP2011/004740.

(Continued)

*Primary Examiner* — Kaitlin Joerger
(74) *Attorney, Agent, or Firm* — Oliff PLC

(57) ABSTRACT

Provided is a plate-shaped member transfer facility capable of inserting a plate-shaped member in a raised state into a rack and retrieving the plate-shaped member in the raised state from the rack. A stocker facility includes: a rack configured to store glass plates such that the stored glass plates are arranged in a front-rear direction in a raised state; and a track robot configured to transfer the glass plates between the track robot and the rack by moving the glass plates to the left and right. The track robot includes a track-side running base, a flip, a track-side conveyance base, and rollers.

11 Claims, 29 Drawing Sheets

(51) Int. Cl.
*H01L 21/673* (2006.01)
*H01L 21/677* (2006.01)

(52) U.S. Cl.
CPC .... *H01L 21/67736* (2013.01); *H01L 21/67769* (2013.01)

(56) References Cited

U.S. PATENT DOCUMENTS

| | | | |
|---|---|---|---|
| 8,590,688 B2* | 11/2013 | Weigl | 198/346.1 |
| 2008/0079217 A1* | 4/2008 | Piazza | 271/264 |
| 2010/0011935 A1* | 1/2010 | Plant et al. | 83/879 |
| 2011/0081221 A1* | 4/2011 | Balbi et al. | 414/225.01 |
| 2011/0085878 A1* | 4/2011 | Balbi et al. | 414/222.01 |
| 2013/0094925 A1* | 4/2013 | Wang | 414/277 |
| 2013/0156531 A1* | 6/2013 | Hashimoto et al. | 414/267 |
| 2013/0202393 A1* | 8/2013 | Hashimoto et al. | 414/277 |

FOREIGN PATENT DOCUMENTS

| | | |
|---|---|---|
| JP | A-2002-522238 | 7/2002 |
| JP | A-2009-238904 | 10/2009 |
| WO | WO 00/07780 A1 | 2/2000 |

OTHER PUBLICATIONS

Oct. 16, 2014 Search Report issued in Chinese Application No. 2011800400795 (with translation).

\* cited by examiner

PLATE-SHAPED MEMBER TRANSFER FACILITY

TECHNICAL FIELD

The present invention relates to a plate-shaped member transfer facility including racks and a plate-shaped member transfer mechanism, in which the racks are each capable of storing a plurality of plate-shaped members such that the stored plate-shaped members are arranged in a raised state, and the plate-shaped member transfer mechanism is configured to insert the plate-shaped members into the racks and to retrieve the plate-shaped members from the racks.

BACKGROUND ART

Conventionally, there have been known various conveying apparatuses for use in conveying substrates. As one of such various conveying apparatuses, Patent Literature 1 discloses a robot configured to store substrates into racks (or into cassettes or the like) and to retrieve the stored substrates from the racks. The robot disclosed in Patent Literature 1 includes a robot arm. The robot arm includes three links. These three links are each rotatably connected around a vertical axis extending in the vertical direction. An end effector is attached to the distal end of the robot arm. The end effector is configured such that a substrate can be placed on the distal end portion of the end effector. The distal end portion of the end effector is configured to be rotatable around a horizontal axis extending in the horizontal direction.

The robot thus configured performs operations such as moving the end effector while rotating the three links, thereby inserting a substrate placed on the end effector into a rack or retrieving the substrate from the rack. The robot can also raise or lay down the substrate placed on the end effector by rotating the distal end portion of the end effector around the horizontal axis. Therefore, the end effector can be inserted into the rack from various directions. Accordingly, the substrate can be inserted into or retrieved from the rack regardless of the facing direction of the rack.

CITATION LIST

Patent Literature

PTL 1: Japanese National Phase PCT Laid-Open Publication No. 2002-522238

SUMMARY OF INVENTION

Technical Problem

The robot disclosed in Patent Literature 1 is configured to insert the end effector into a substrate container of a rack 84, the substrate container storing substrates, at the time of inserting or retrieving substrates 81 to 83 into or from the rack 84. Meanwhile, as shown in FIGS. 29 and 30, the plurality of substrates 81 to 83 are, when stored in the rack 84, arranged in an arrangement direction so that the substrates will not come into contact with each other. Accordingly, in a case where the plurality of substrates 81 to 83 are sequentially carried out of the rack 84 starting from the substrate 81 stored at the front, open space into which the end effector 85 can be inserted is created in front of each of the substrates 81 to 83 to be carried out. Therefore, in this case, the carrying-out of the substrates can be performed by using the end effector 85 with no problem.

However, the plurality of substrates 81 to 83 stored in the rack 84 are not necessarily sequentially carried out of the rack 84 starting from the substrate 81 stored at the front. There is often a case where the substrate 82 stored between two substrates 81 and 83 is retrieved from the rack first. In this case, the end effector 85 needs to be inserted between two substrates 81 and 82 (or substrates 82 and 83).

Generally speaking, spacing between adjacent substrates stored in the rack 84 is small for the purpose of densely storing the substrates and increasing a storable number of substrates relative to the installation area of the rack 84. On the other hand, the thickness of the end effector 85 is large in order for the end effector 85 to have a function of holding each of the substrates 81 to 83 in a sandwiching manner and to have strength. Therefore, when an attempt is made to insert the end effector 85 between two substrates 81 and 82 (or substrates 82 and 83), the end effector 85 cannot be inserted, or even if the end effector 85 can be inserted between the two substrates, there is a risk that the end effector 85 comes into contact with, for example, the substrates 81 to 83 and thereby the substrates become damaged. For this reason, it is necessary to significantly increase spacing among the substrates stored in the rack 84, which, however, results in an increase in the installation area of the rack 84.

Such a problem occurs not only when the substrates 81 to 83 are carried out of the rack 84 but also when the substrates 81 to 83 are carried into the rack 84. That is, there is no problem when the substrates 81 to 83 are carried into the rack 84 sequentially in the arrangement direction; however, in a case where two substrates 81 and 83 are carried into the rack 84 first and thereafter the substrate 82 is carried into the rack 84, there occurs a problem that is similar to one occurring at the time of carrying substrates out of the rack 84. In order to eliminate the problem, it is again necessary to significantly increase spacing among the substrates 81 to 83 stored in the rack 84, which results in an increase in the installation area of the rack 84.

In view of the above, an object of the present invention is to provide a plate-shaped member transfer facility which is capable of, even if plate-shaped members are densely stored in a rack with narrow spacing among them, additionally carrying a plate-shaped member into between two spaced apart plate-shaped members in the rack and carrying out of the rack any plate-shaped member from among the plurality of plate-shaped members arranged in the rack, without inserting an end effector into the substrate container of the rack.

Solution to Problem

A plate-shaped member transfer facility according to the present invention includes: a rack configured to store a plurality of plate-shaped members, which are supported by a support so as to be raised and extend in a conveying direction, such that the plurality of plate-shaped members stored in the rack are arranged in an arrangement direction crossing the conveying direction, the rack being configured to allow each of the plurality of plate-shaped members to be carried into and out of the rack in the conveying direction through an insertion opening; and a plate-shaped member transfer mechanism configured to carry each plate-shaped member into or out of the rack in the conveying direction through the insertion opening. The plate-shaped member transfer mechanism includes: a flip rotation mechanism positioned in track-side space facing the insertion opening of the rack, the flip rotation mechanism including a flip configured to support the plate-shaped member and be rotatable around a rotation axis parallel to the conveying direction, the flip rotation mechanism being configured to rotate the flip to raise or lay down the plate-shaped member; a conveyance mechanism extending in the conveying direction and including a sender configured to send, in the conveying direction, the plate-shaped member that has been raised by the flip rotation mechanism; and a moving mechanism configured to move the flip rotation mechanism and the conveyance mechanism in the arrangement direction. The conveyance mechanism is configured to transfer the plate-shaped member in the raised state between the track-side space in which the flip rotation mechanism is positioned and the rack by means of the sender.

According to the present invention, the plate-shaped member transfer mechanism can raise the plate-shaped member supported by the flip, by rotating the flip by means of the flip rotation mechanism. Further, by moving the flip rotation mechanism and the conveyance mechanism to a given position of the rack in the arrangement direction and moving the plate-shaped member in the raised state in the conveying direction by means of the sender, the plate-shaped member transfer mechanism can carry the plate-shaped member in the track-side space into the rack through the insertion opening, thereby storing the plate-shaped member in the rack. Thus, the plate-shaped member transfer mechanism can raise the plate-shaped member from a horizontal state, and insert the plate-shaped member into the rack for storage. It should be noted that, in the present invention, the term "horizontal state" includes not only a state where the plate-shaped member is in a truly horizontal orientation but also a state where the plate-shaped member is slightly inclined from the truly horizontal orientation.

Further, according to the present invention, the plate-shaped member stored in the rack can be moved in the conveying direction and returned to the track-side space, by moving the flip rotation mechanism and the conveyance mechanism to the given position of the rack and then driving the sender. Then, after the plate-shaped member returned to the track-side space has moved onto the flip which serves as an end effector, the plate-shaped member can be caused to be in the horizontal state by laying down the plate-shaped member through rotation of the flip by means of the flip rotation mechanism. Thus, the plate-shaped member transfer mechanism can retrieve the plate-shaped member stored in the rack in the raised state from the rack and then cause the plate-shaped member to be in the horizontal state.

As described above, according to the present invention, the plate-shaped member is moved and transferred in the conveying direction by means of the sender. Therefore, it is not necessary to directly insert the conveyance mechanism or the flip into the rack at the time of carrying the plate-shaped member into or out of the rack. Accordingly, unlike conventional art, even if the plate-shaped members are densely stored with narrow spacing among them in the arrangement direction in order to reduce the installation area of the facility, a risk that the end effector comes into contact with a stored plate-shaped member to cause damage to the plate-shaped member is eliminated in the following situations: a situation where a plate-shaped member is additionally carried into between two plate-shaped members; and a situation where a plate-shaped member at a given position is carried out from among a plurality of arranged plate-shaped members. Therefore, the plate-shaped members can be carried into and out of the rack securely and speedily.

The above invention preferably includes: a track-side sending part serving as the sender; a track-side conveyance mechanism disposed in the track-side space; a rack-side sending part serving as the sender; and a rack-side conveyance mechanism disposed at the rack.

According to the above configuration, the plate-shaped member can be transferred between the track-side and rack-side conveyance mechanisms, by moving the track-side conveyance mechanism to the front of the rack-side conveyance mechanism at a storage position by means of the moving mechanism and then driving the track-side and rack-side sending parts. Therefore, it is not necessary to slide and insert the conveyance mechanism into the rack, and accordingly, a time for sliding and inserting the conveyance mechanism into the rack can be eliminated, which makes it possible to reduce the time for carrying each plate-shaped member into or out of the rack.

In the above invention, the track-side conveyance mechanism and the rack-side conveyance mechanism are preferably configured to transfer the plate-shaped member in the raised state between the track-side sending part and the rack-side sending part.

According to the above configuration, the plate-shaped member can be transferred between the track-side conveyance mechanism and the rack-side conveyance mechanism. Therefore, the plate-shaped member can be inserted into the rack without sliding and inserting the track-side and rack-side conveyance mechanisms into the rack.

In the above invention, the moving mechanism preferably includes: a track-side moving mechanism configured to move the track-side conveyance mechanism in the arrangement direction; and a rack-side moving mechanism configured to move the rack-side conveyance mechanism in the arrangement direction.

According to the above configuration, it is not necessary to provide the rack-side conveyance mechanism for each storage position of the rack, which realizes reduction in the number of components. Moreover, for example, the track-side conveyance mechanism and the rack-side conveyance mechanism may be moved independently of each other to respective positions, and thereby the track-side conveyance mechanism and the rack-side conveyance mechanism can be operated at the respective different positions, and the track-side conveyance mechanism and the rack-side conveyance mechanism can perform respective different operations in parallel. In this manner, the carry-in time and carry-out time can be reduced.

In the above invention, the track-side moving mechanism is preferably configured to move the track-side conveyance mechanism and the flip rotation mechanism together in the arrangement direction.

According to the above configuration, the flip rotation mechanism and the track-side conveyance mechanism are moved together. Therefore, positional alignment between these mechanisms is not necessary, and an operating program for each mechanism can be made simple. In addition, the number of components of the moving mechanism can be reduced, and the manufacturing cost can be reduced, accordingly.

In the above invention, it is preferred that the rack includes a plurality of support members; the plurality of support members are arranged to be spaced apart from each other in the conveying direction, and are configured to support the plate-shaped member at upper surfaces of the respective support members; the rack-side sending part includes a rack-side driving member configured to send the plate-shaped member by moving the plate-shaped member on a face of the rack-side sending part; and the rack-side conveyance mechanism is configured to lift and lower the rack-side sending part between a rack-side conveyance position and a rack-side standby position, the rack-side conveyance position being a position at which the face of the rack-side sending part is positioned higher than the upper surfaces of the support members, the rack-side standby position being a position at which the face of the rack-side sending part is positioned lower than the upper surfaces of the support members.

According to the above configuration, by lifting the rack-side sending part to the rack-side conveyance position, the plate-shaped member can be moved smoothly within the rack in the left-right direction without causing the plate-shaped member to come into contact with the support members, and the plate-shaped member can be transferred smoothly between the rack and the track-side space. Also, by lowering the rack-side sending part to the rack-side standby position, the plate-shaped member placed on the face of the rack-side sending part can be lowered onto the support members and stored in the rack such that the plate-shaped member is away from the face of the rack-side sending part. In this manner, damage to the plate-shaped member can be suppressed during the storing work.

In the above invention, it is preferred that the track-side sending part includes a track-side driving member configured to send the plate-shaped member by moving the plate-shaped member on a face of the track-side sending part, and the track-side conveyance mechanism is configured to lift and lower the track-side sending part between a track-side conveyance position and a track-side standby position, the track-side conveyance position being a position at which the face of the track-side sending part is positioned at a height that is substantially the same as a height of the face of the rack-side sending part when the rack-side sending part is at the rack-side conveyance position, the track-side standby position being a position at which the face of the track-side sending part is positioned lower than the upper surfaces of the support members.

According to the above configuration, by lifting the track-side sending part to the conveyance position, the plate-shaped member can be moved smoothly within the rack in the left-right direction without causing the plate-shaped member to come into contact with the support members, and the plate-shaped member can be transferred smoothly between the rack and the track-side space. In this manner, damage to the plate-shaped member can be suppressed during the storing work. Since the track-side sending part can be lowered to the standby position, the track-side sending part can be removed from the plate-shaped member in the middle of inserting the plate-shaped member into the rack and the track-side sending part can be moved to the front of a next storage position before the rack-side conveyance mechanism is moved to the next storage position. In this manner, the time for carrying-out of the plate-shaped member can be reduced.

It is preferred that the above invention further includes a position detection sensor configured to detect whether the track-side sending part and the rack-side sending part are aligned in the conveying direction, and the track-side sending part and the rack-side sending part are configured to perform transfer of the plate-shaped member when the position detection sensor detects that the track-side sending part and the rack-side sending part are aligned in the conveying direction.

According to the above configuration, failing in transferring the plate-shaped member between the track-side sending part and the rack-side sending part to cause damage to the plate-shaped member can be prevented.

In the above invention, the flip rotation mechanism is preferably configured to rotate the flip to lay down the plate-shaped member supported by the flip when the flip rotation mechanism is moved by the moving mechanism.

According to the above configuration, the flip rotation mechanism is moved with the plate-shaped member laid down. In this manner, the amount of wind that occurs when the plate-shaped member is moved can be reduced. The wind occurring when the plate-shaped member is moved causes the plate-shaped members arranged and stored in the rack to flutter, causing a risk that the plate-shaped members become damaged. Since the present invention is capable of suppressing the wind from occurring, such fluttering of the plate-shaped members can be suppressed and thereby damage to the plate-shaped members can be prevented.

In the above invention, it is preferred that the flip includes a plurality of rollable spherical rollers, and is configured to support a rear surface of the plate-shaped member by means of the plurality of spherical rollers.

According to the above configuration, the plate-shaped member is supported by the rollable spherical rollers. Therefore, when the plate-shaped member is moved by the sender, the plate-shaped member may be slidingly moved while being leaned against the flip, and even in such a manner, the plate-shaped member can be moved smoothly. Therefore, when the plate-shaped member is transferred between the rack and the flip, the plate-shaped member can be slidingly moved along the flip and the flip prevents the plate-shaped member from falling over.

The above object, other objects, features, and advantages of the present invention will be made clear by the following detailed description of preferred embodiments with reference to the accompanying drawings.

Advantageous Effects of Invention

According to the present invention, even if plate-shaped members are densely stored in a rack with narrow spacing among them, a plate-shaped member can be additionally carried into between two spaced apart plate-shaped members in the rack, and also, any plate-shaped member among the plurality of plate-shaped members arranged in the rack can be carried out of the rack, without inserting an end effector into the substrate container of the rack.

BRIEF DESCRIPTION OF DRAWINGS

FIG. 8A is a right side view showing an upper portion of the rack in an enlarged manner; and FIG. 8B is a right side view showing a lower portion of the rack in an enlarged manner.

FIG. 11A shows a state where a rack-side conveyance mechanism and a track-side conveyance mechanism are not aligned in an arrangement direction; and FIG. 11B shows a state where the rack-side conveyance mechanism and the track-side conveyance mechanism are aligned in the arrangement direction.

DESCRIPTION OF EMBODIMENTS

Hereinafter, a stocker facility 1, which is a plate-shaped member transfer facility according to one embodiment of the present invention, is described with reference to the above drawings. It should be noted that directions mentioned in the embodiment, such as up-down, left-right, and front-rear directions, are used for the sake of convenience of the description, but do not suggest that the arrangement, orientation, and the like of the components of the stocker facility 1 are limited to such directions. The stocker facility 1 described below is merely one embodiment of the present invention. The present invention is not limited to embodiments below, and additions, deletions, and modifications can be made to the embodiments without departing from the spirit of the present invention.

[Stocker Facility]

Figure 1:
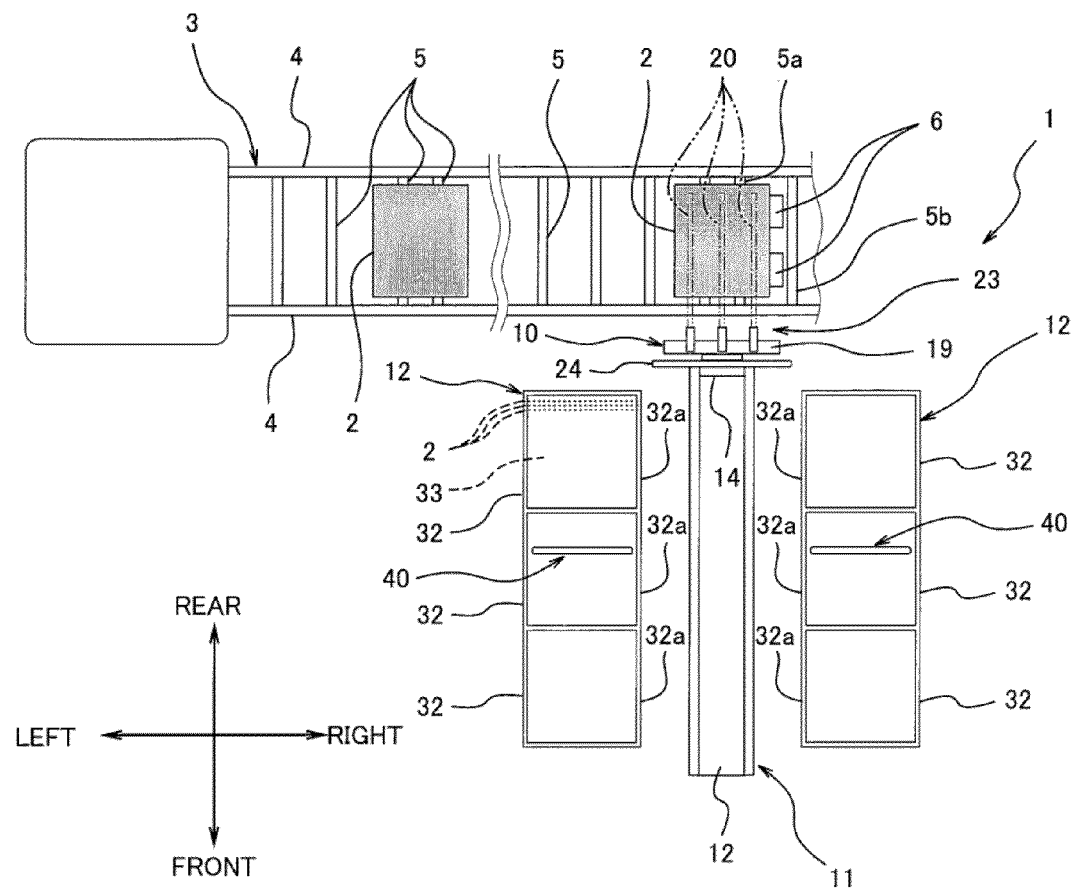
FIG. 1 is a plan view showing an overall stocker facility according to an embodiment of the present invention.

As shown in FIG. 1, the stocker facility 1 is provided along a conveyance path on which plate-shaped members 2 are conveyed from one processing apparatus to another processing apparatus, and is used for temporarily storing the conveyed plate-shaped members 2. The plate-shaped member 2 is, for example, a large-sized glass plate to be used for a solar panel or a liquid crystal panel. In the description below, the plate-shaped member 2 is referred to as a glass plate 2. However, the plate-shaped member 2 is not limited to a large-sized glass plate, but may be a steel plate or resin plate, that is, the plate-shaped member 2 may be any plate-shaped member. In the present embodiment, the stocker facility 1 is provided at a wheel conveyor 3 configured to convey glass plates 2 from one processing apparatus to another processing apparatus.

The wheel conveyor 3 includes a pair of beams 4 extending along the conveyance path. The pair of beams 4 are provided with a plurality of wheel shafts 5. The wheel shafts 5 span between the pair of beams 4 in a rotatable manner, such that the wheel shafts 5 extend perpendicularly to the pair of beams 4. A driving unit which is not shown drives the wheel shafts 5 to rotate. When the wheel shafts 5 are driven to rotate, glass plates 2 placed on the wheel shafts 5 move in one direction (in the present embodiment, to the right), accordingly.

The wheel conveyor 3 further includes stoppers 6. The stoppers 6 are provided between two adjacent wheel shafts 5a and 5b. The stoppers 6 are configured to protrude and withdraw in the up-down direction. When the stoppers 6 are caused to protrude, a glass plate 2 moving on the wheel conveyor 3 is stopped at a stop position, and when the stoppers 6 are caused to withdraw, the glass plate 2 is allowed to move from the stop position to the downstream side (i.e., to the right). The stocker facility 1 is configured to temporarily stock the glass plate 2 stopped by the stoppers 6, and to return the stocked glass plate 2 onto the wheel conveyor 3 to transfer the glass plate 2 to the other processing apparatus. Hereinafter, a specific configuration of the stocker facility 1 is described.

<Track Robot>

Figure 2:
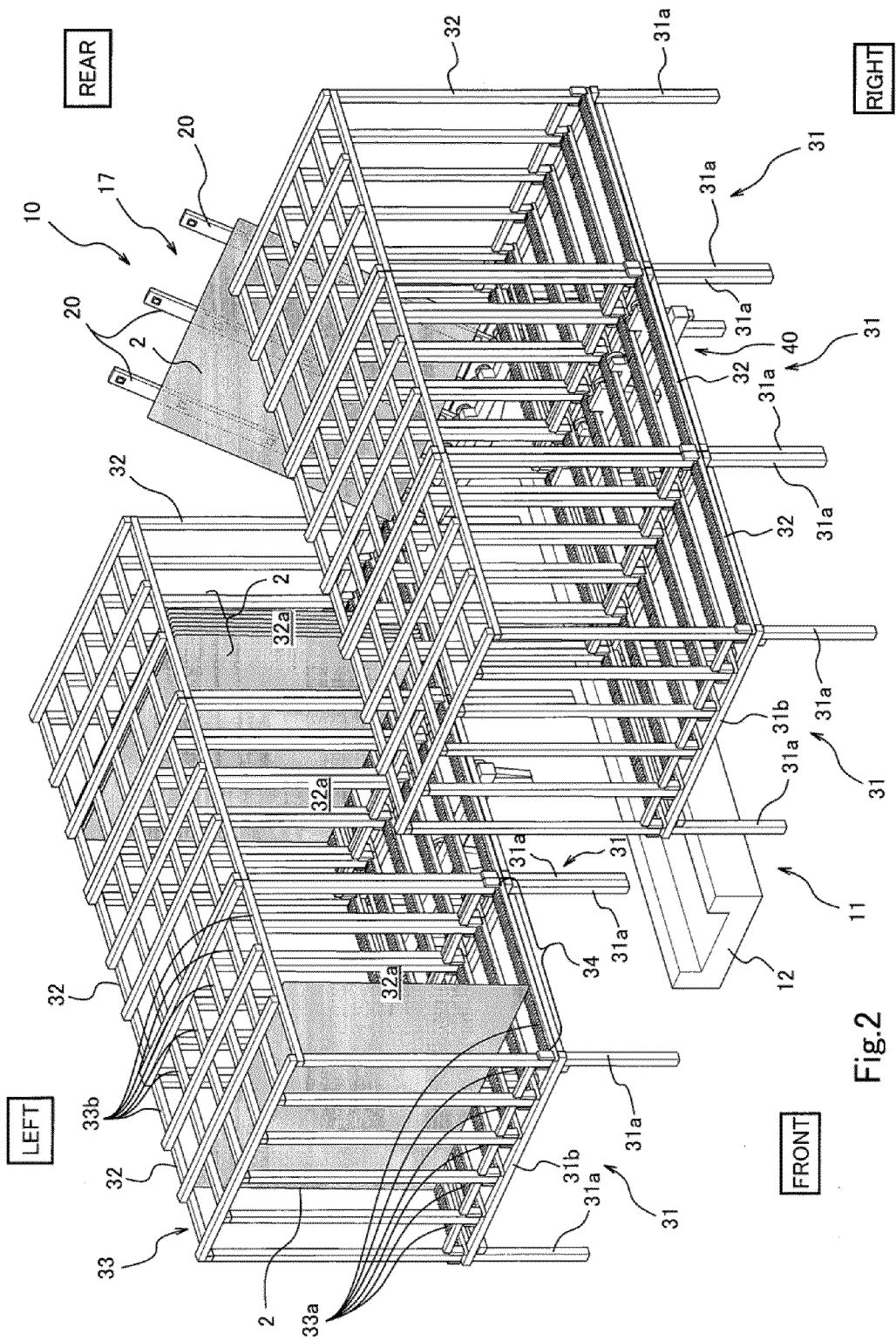
FIG. 2 is a perspective view showing in an enlarged manner a track robot and racks included in the stocker facility shown in FIG. 1.
Figure 3:
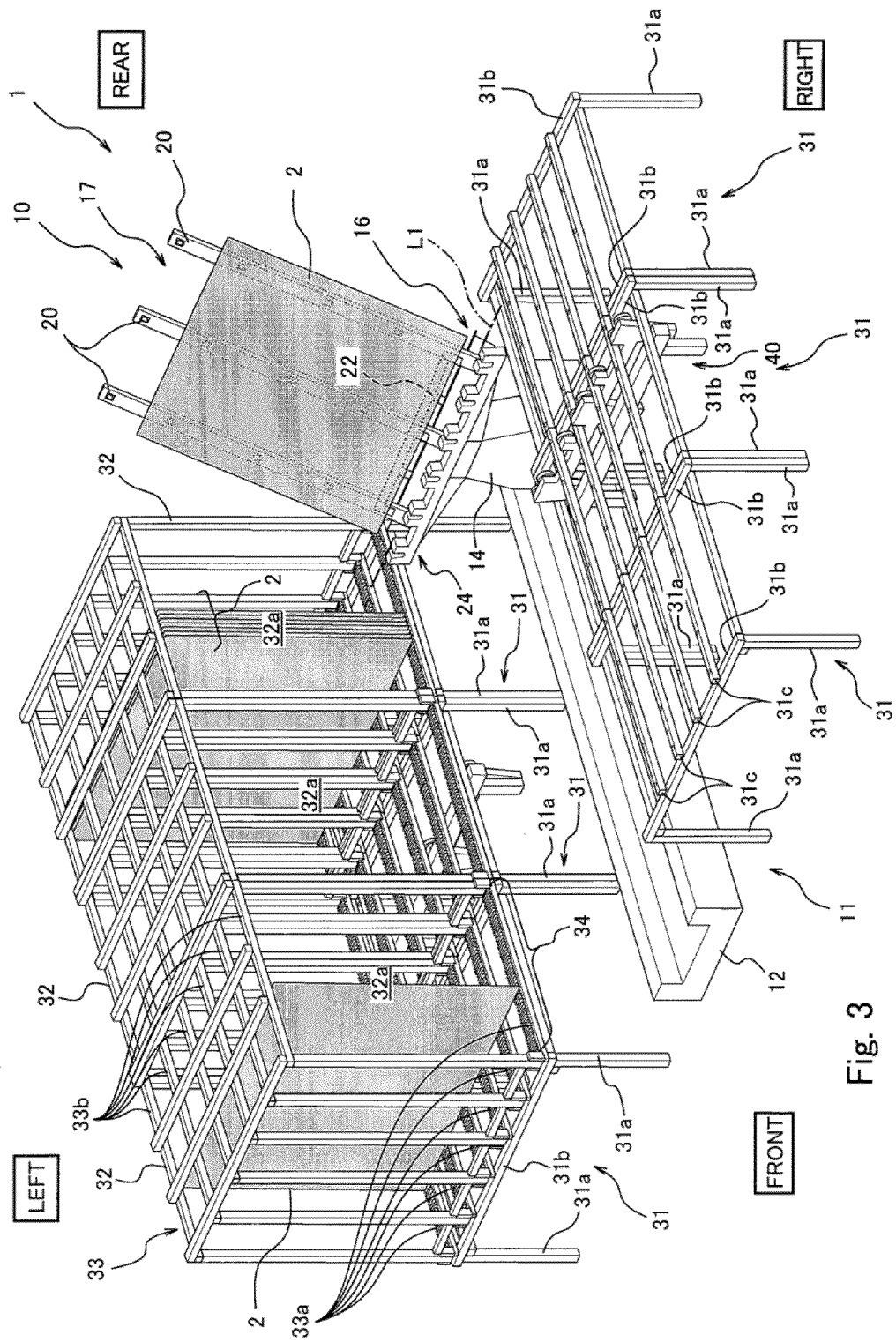
FIG. 3 is a perspective view showing a state where the plurality of racks included in the stocker facility shown in FIG. 2 are partially removed.
Figure 4:
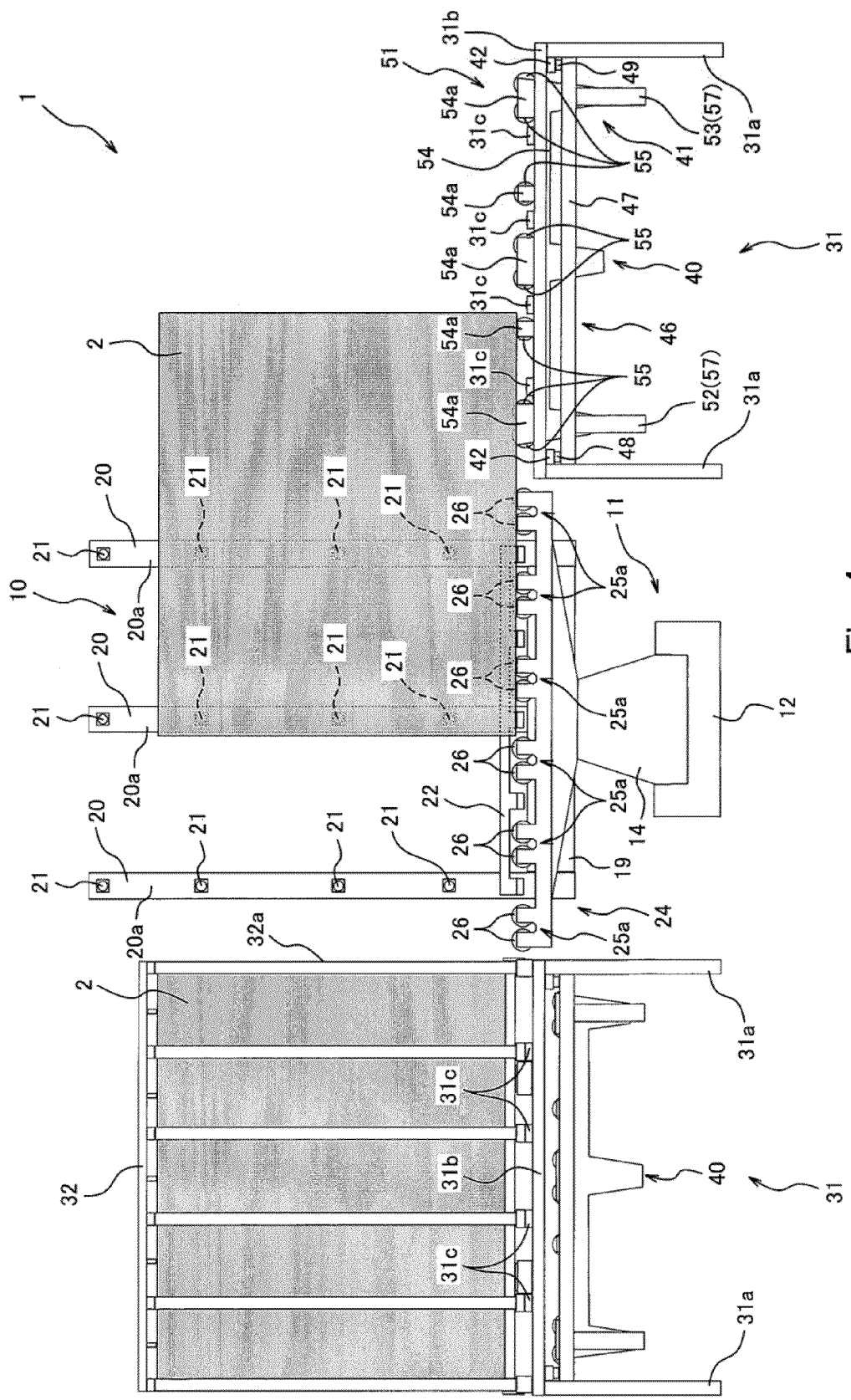
FIG. 4 is a front view of the stocker facility shown in FIG. 3.

As shown in FIG. 1 to FIG. 7, the stocker facility 1 includes a track robot 10 and racks 32. In the stocker facility 1, one line of multiple racks 32 and the other line of multiple racks 32 are arranged at the left side and the right side, respectively, with the track robot 10 provided between the lines of multiple racks 32. The track robot 10 includes a sliding apparatus 11 as shown in FIG. 2 to FIG. 4. The sliding apparatus 11, which serves as a track-side moving mechanism, includes a guide rail 12 and a track-side slide actuator 13 (see FIG. 5). The guide rail 12 is fixed to, for example, the floor of the installation location. One end of the guide rail 12 is positioned near the wheel conveyor 3, and from that position, the guide rail 12 extends in the front-rear direction between the lines of multiple racks 32. A track-side running base 14 is slidably attached onto the guide rail 12. The guide rail 12 accommodates the track-side slide actuator 13 therein. For example, the track-side slide actuator 13 includes a ball screw mechanism and a servomotor, and is configured to cause the track-side running base 14 to slide in the front-rear direction along the guide rail 12 (see arrow A in FIG. 6).

Figure 7:
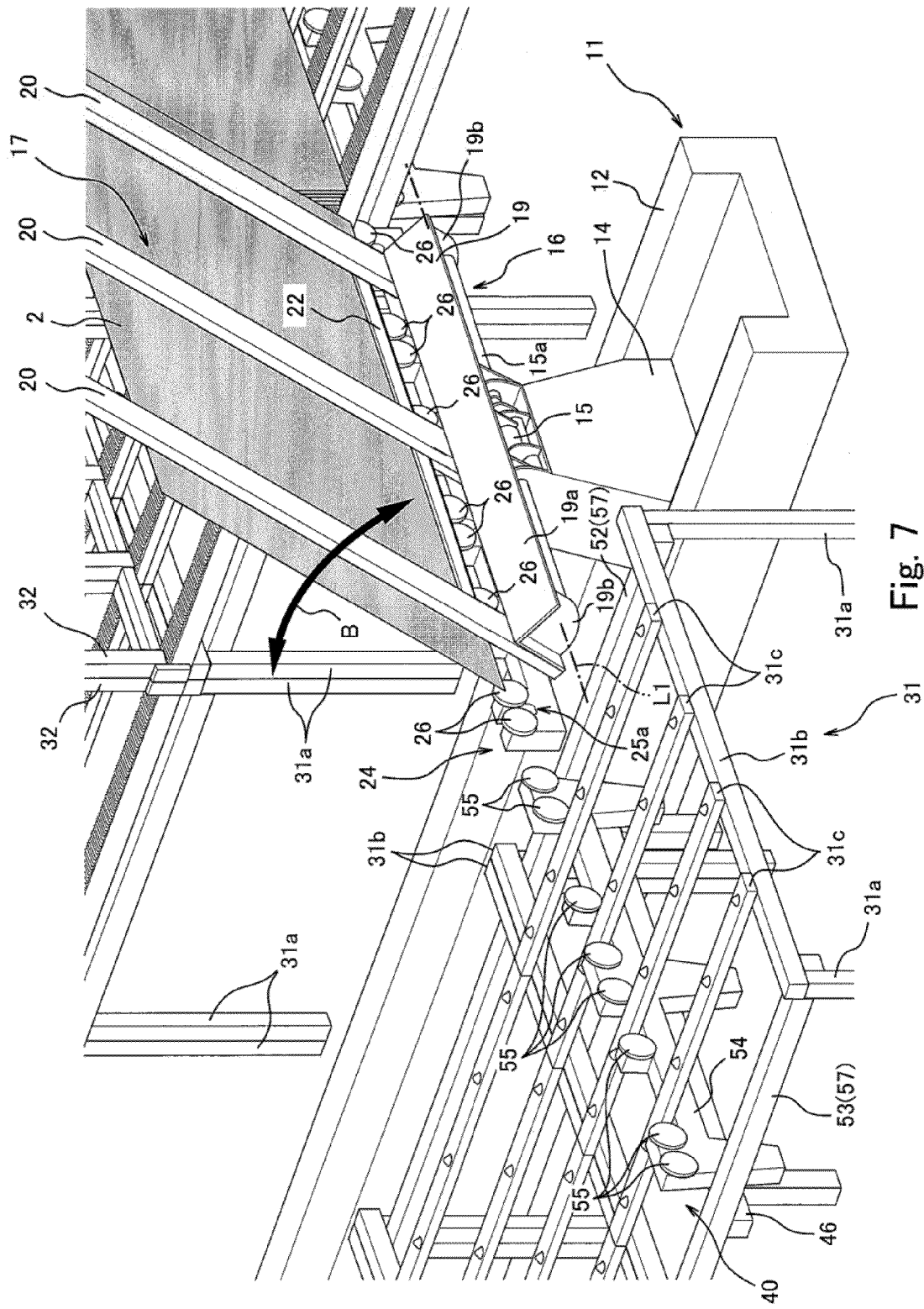
FIG. 7 is an enlarged perspective view of the track robot of the stocker facility shown in FIG. 3, which is seen from the rear side.

The track-side running base 14 is formed to be roughly in a trapezoidal shape. As shown in FIG. 7, a hinge 15 is provided at an upper rear portion of the track-side running base 14, and a flip rotation mechanism 16 is further provided via the hinge 15. The flip rotation mechanism 16 includes a flip 17 and a flip actuator 18 (see FIG. 5). The flip 17 serves as a so-called hand or end effector, and is attached to the hinge 15. The flip 17 is formed to be roughly in a three-pronged shape, and is configured to support a glass plate 2 placed thereon. The flip 17 thus configured is rotatable via the hinge 15 around a rotation axis L1 extending in the left-right direction.

The track-side running base 14 is provided with the flip actuator 18. For example, the flip actuator 18 is a servomotor, and is configured to rotate the flip 17 around the rotation axis L1. The flip 17 is configured such that the orientation of the flip 17 can be changed by means of the flip actuator 18 between a horizontal orientation and an upright orientation. In the horizontal orientation, the flip 17 is laid down backward to be horizontal, and in the upright orientation, the flip 17 is set substantially upright (see arrow B in FIG. 6 and arrow B in FIG. 7).

Figure 6:
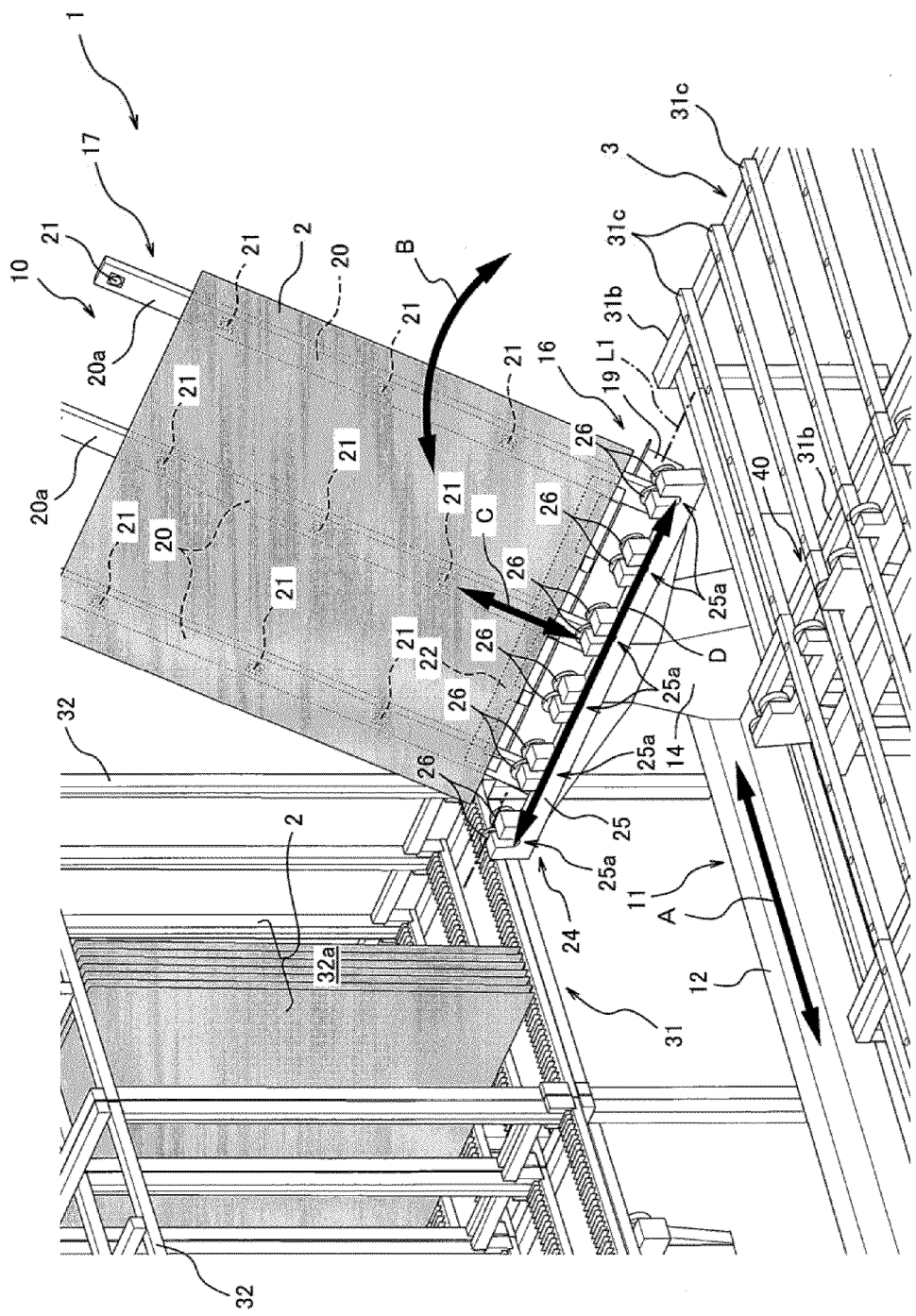
FIG. 6 is a perspective view showing in an enlarged manner the track robot of the stocker facility shown in FIG. 3.

Hereinafter, a more detailed description of the flip 17 is given with reference to FIG. 6 and FIG. 7. The flip 17 includes a base 19 and three support plates 20. The base 19 includes an L-shaped plate 19a and a pair of attachment plates 19b. The L-shaped plate 19a extends in the left-right direction. Two plates forming the L-shaped plate 19a are arranged so as to be perpendicular to each other, such that a cross section obtained when the two plates are cut in a direction perpendicular to the left-right direction becomes an L-shaped cross section. The pair of attachment plates 19b are attached to the left and right ends of the L-shaped plate 19a, respectively. The attachment plates 19b are arranged in a raised state between the two plates. A hinge shaft 15a is attached between the two plates so as to connect the attachment plates 19b. The hinge shaft 15a forms part of the hinge 15, and is attached to the track-side running base 14 such that the hinge shaft 15a is rotatable around the rotation axis L1. As shown in FIGS. 6 and 7, the three support plates 20 are attached to the front surface of the L-shaped plate 19a.

As shown in FIGS. 6 and 7, the support plates 20 are strip-shaped plate members extending from the L-shaped plate 19a obliquely backward and upward, and the lower ends of the respective support plates 20 are fixed to the base 19. The support plates 20 are configured such that the orientation of the support plates 20 can be changed between an upright orientation and a horizontal orientation by rotating the base 19 around the rotation axis L1. In the upright orientation, the support plates 20 are set upright in the up-down direction, and in the horizontal orientation, the support plates 20 extend in a substantially horizontal manner. The three support plates 20 thus configured are arranged at substantially equal intervals in the left-right direction. The intervals among the support plates 20 are designed in accordance with the intervals among the wheel shafts 5 of the wheel conveyor 3. Accordingly, when the support plates 20 are caused to be in the horizontal orientation, each support plate 20 comes between adjacent wheel shafts 5a to become located at the stop position of the wheel conveyor 3.

A plurality of spherical rollers 21 (in the present embodiment, four spherical rollers 21) are attached to an upper surface 20a of each support plate 20 (the upper surface 20a corresponds to the front surface of the support plate 20 when the support plate 20 is in the upright orientation). The plurality of spherical rollers 21 are attached to each support plate 20 in a rollable manner, and arranged so as to be spaced apart from each other in a direction (the up-down direction in FIG. 6) in which the support plate 20 extends. The spherical rollers 21 partially protrude upward from the upper surface 20a of each support plate 20, so that the spherical rollers 21 support, by point support, a glass plate 2 placed on the upper surface 20a. A support 22 is attached to the upper surfaces 20a of the respective support plates 20. The support 22 is formed to be roughly in a five-pronged shape, and is disposed so as to be nearer to the proximal ends of the support plates 20 than the spherical rollers 21. The support 22 is configured such that the distal end portions (i.e., lower end portions) of the support 22 protrude forward so that the protruding portions can receive and support the lower end of the glass plate 2. The support 22 thus configured is provided with a lift cylinder 23. The support 22 is configured to be lifted and lowered in the up-down direction by means of the lift cylinder 23 (see arrow C of FIG. 6).

A track-side conveyance mechanism 24 is attached to the upper front side of the track-side running base 14. The track-side conveyance mechanism 24 includes a track-side conveyance base 25. The track-side conveyance base 25 is a plate-shaped member which is long from side to side in the left-right direction, and the left and right ends of the track-side conveyance base 25 extend to the vicinity of left-side and right-side racks 32, respectively. A plurality of attachment portions 25a (in the present embodiment, six attachment portions 25a) are formed at the upper portion of the track-side conveyance base 25. The attachment portions 25a are arranged at substantially equal intervals in the left-right direction. A notch extending in the up-down direction is formed substantially at the center of each attachment portion 25a. A roller 26 serving as a track-side driving member is attached to each of left-side and right-side portions of the attachment portion 25a, the left-side and right-side portions being divided by the notch.

The rollers 26 are attached to the rear of the track-side conveyance base 25 in an interspaced manner. In the present embodiment, twelve rollers 26 are attached to the track-side conveyance base 25. It should be noted that the driving member may be alternatively configured as a belt. For example, pulleys may be provided instead of the rollers 26, and the driving member may be realized by stretching a belt around the two or more pulleys.

The rollers 26 are each configured to be rotatable around a rotation axis extending in the front-rear direction. A track-side roller actuator 27 is provided within the track-side conveyance base 25 (see FIG. 5). For example, the track-side roller actuator 27 includes a transmission mechanism and a servomotor. The transmission mechanism is configured as a timing belt, for example. The track-side roller actuator 27 is configured to rotate the plurality of rollers 26 in conjunction with each other in the same direction. The rollers 26 are formed such that a glass plate 2 can be placed thereon. The rollers 26 and the track-side roller actuator 27 thus configured form a track-side sending part. The track-side sending part can send the glass plate 2 placed on the rollers 26 to the left or right by driving the rollers 26 by means of the track-side roller actuator 27 (see arrow D in FIG. 6).

Figure 5:
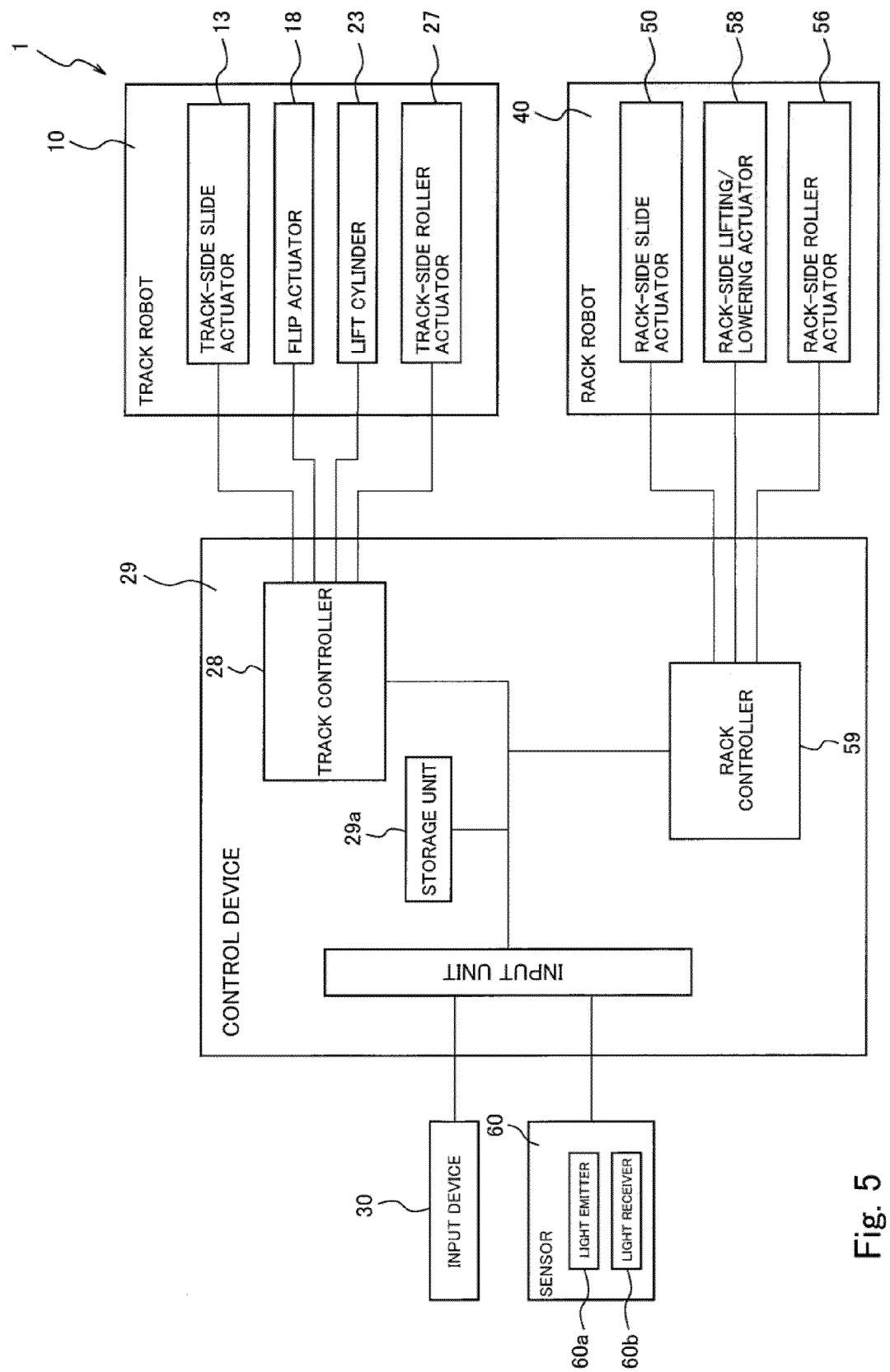
FIG. 5 is a block diagram showing a control system configuration of the stocker facility shown in FIG. 1.

As shown in FIG. 5, the track robot 10 includes a track controller 28 configured to control the operations of the actuators 13, 18, 27, and the cylinder 23 included in the track robot 10. The track controller 28 is a control block forming part of a control device 29 included in the stocker facility 1. The track controller 28 is connected to the track-side slide actuator 13, the flip actuator 18, the lift cylinder 23, and the track-side roller actuator 27 via signal wiring. The track controller 28 has a function of controlling the operations of the actuators 13, 18, 27, and the cylinder 23 by sending signals to the actuators 13, 18, 27, and the cylinder 23 based on a program prestored in a storage unit 29*a* of the control device 29 and commands inputted via an input device 30.

<Rack and Rack Robot>

As shown in FIG. 3, a plurality of rack bases 31 are provided at both the left and right sides of the track robot 10 having the above configuration. The rack bases 31 are underframes as shown in FIG. 3, and are fixed to, for example, the floor of the installation location. Specifically, each rack base 31 is formed in a rectangular shape when seen in plan view. Each rack base 31 has four legs 31*a* and two beam members 31*b*. The four legs 31*a* are arranged at four corners, respectively. Each beam member 31*b* is fixed to the upper end of a corresponding pair of left and right legs 31*a* so as to span between the legs 31*a*. The two beam members 31*b* thus fixed are arranged parallel to each other and spaced apart from each other in the front-rear direction. A plurality of cross-girder members 31*c*, which extend in the front-rear direction, span between the two beam members 31*b*, and a rack 32 is mounted on the cross-girder members 31*c*.

Figure 8A:
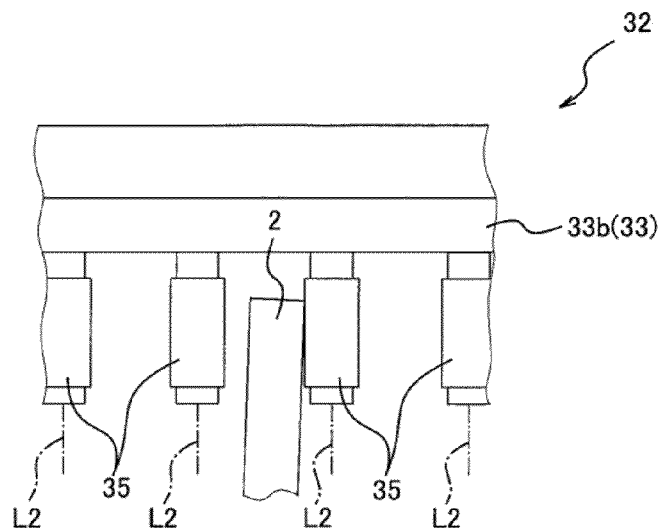
FIGS. 8A and 8B are right side views each showing part of a rack of the stocker facility in an enlarged manner.
Figure 8B:
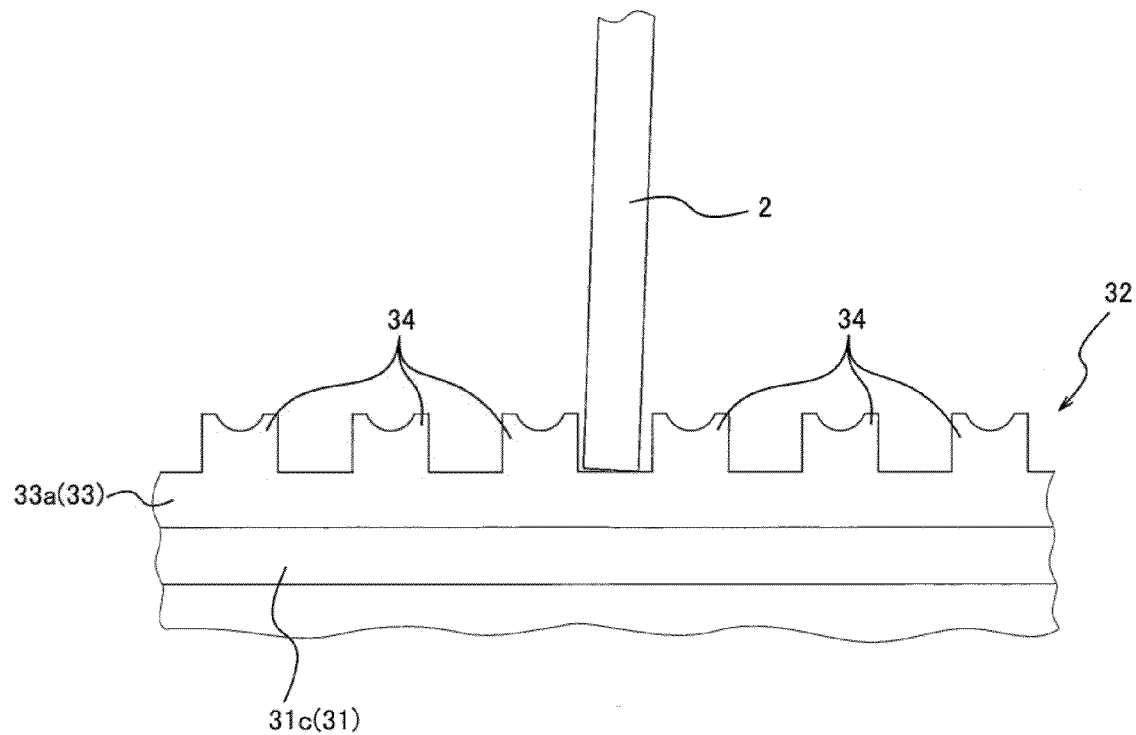

As shown in FIGS. 2 to 4, the rack 32 has a frame body 33 which is a hutch-like or cage-like parallelepiped framework. The frame body 33 has a plurality of bottom girders 33*a* at the bottom and a plurality of top girders 33*b* at the ceiling. Similar to the cross-girder members 31*c*, the bottom girders 33*a* extend in the front-rear direction and are arranged so as to be spaced apart from each other in the left-right direction. As shown in FIG. 8B, a plurality of separators 34 are provided at the upper surface of each bottom girder 33*a*. The plurality of separators 34 are upward protruding members which are arranged at substantially equal intervals in the front-rear direction. The interval between two adjacent separators 34 is slightly wider than the thickness of a glass plate 2.

Similar to the bottom girders 33*a*, the top girders 33*b* extend in the front-rear direction and are arranged so as to be spaced apart from each other in the left-right direction. As shown in FIG. 8A, a plurality of guide rollers 35 are attached to the lower surface of each top girder 33*b*. The plurality of guide rollers 35 are arranged at substantially equal intervals in the front-rear direction. The intervals among the guide rollers 35 are substantially the same as the intervals among the separators 34. The guide rollers 35 thus configured are each rotatable around a rotation axis L2 extending in the up-down direction.

The rack 32 thus configured stores a glass plate 2 such that the glass plate 2 extends in the left-right direction, and such that the lower end of the glass plate 2 is placed between two adjacent separators 34 and the upper end of the glass plate 2 is placed between two adjacent guide rollers 35. In this manner, the lower end of the glass plate 2 is supported by the separators 34 and the upper end of the glass plate 2 is supported by the guide rollers 35, so that the glass plate 2 does not fall over, and thus the glass plate 2 is stored in the rack 32 in a raised state. The rack 32 can store a plurality of glass plates 2 in the same manner, and thus the plurality of glass plates 2 are stored in the rack 32 such that the glass plates 2 are arranged in the front-rear direction (i.e., arrangement direction).

The glass plates 2 are stored such that each glass plate 2 is slightly inclined backward in the rack 32. When seen in plan view, two guide rollers 35 between which the upper end of the glass plate 2 is placed are positioned slightly backward from two separators 34 between which the lower end of the glass plate 2 is placed. The glass plates 2 thus stored are such that each glass plate 2 is placed between two separators 34 and between two guide rollers 35, and thereby adjacent glass plates 2 are separated from each other by the separators 34 and the guide rollers 35. In this manner, the glass plates 2 can be closely arranged in the rack 32 without causing the glass plates 2 to come into contact with each other.

It should be noted that the top girders 33*b* need not be fixed, and in addition, the top girders 33*b* may be configured such that their height is adjustable. One example of an adjustment mechanism configured to adjust the position of the top girders 33*b* is a lifting/lowering mechanism such as a ball screw mechanism. Alternatively, the top girders 33*b* may be configured such that they are manually adjustable without using a lifting/lowering mechanism. If the top girders 33*b* are adjustably configured, then the height of the top girders 33*b* can be adjusted in accordance with the height of the glass plates 2 to be stored in the rack 32. As a result, a wider variety of glass plates 2 can be stored in the rack 32. It should be noted that, in the present embodiment, the top girders 33*b* of all the racks 32 have the same height.

The rack 32 thus configured is mounted on each of the rack bases 31, so that the racks 32 are arranged in the front-rear direction at both the left and right sides of the track robot 10. Each rack 32 has an opening at its both left and right sides, and one of the openings serves as an insertion opening 32*a* into which the glass plates 2 can be inserted. The racks 32 are mounted on the respective rack bases 31, such that their insertion openings 32*a* are positioned at the track robot 10 side (i.e., at the track side). In other words, the track robot 10 is positioned so as to face the insertion openings 32*a*.

To be more specific, the rack 32 that is positioned at the left side of the track robot 10 is mounted on the rack base 31 such that the insertion opening 32*a* is positioned at the right side of the rack 32, and the rack 32 that is positioned at the right side of the track robot 10 is mounted on the rack base 31 such that the insertion opening 32*a* is positioned at the left side of the rack 32. In this manner, the track robot 10 is positioned in track-side space between the two racks 32 so as to face the insertion openings 32*a* of the respective racks 32. Moreover, the racks 32 are fixed to the respective rack bases 31 such that, in each line of racks 32, the faces of the respective insertion openings 32*a* are flush with each other. Furthermore, the rack bases 31 are provided with rack robots 40.

<Rack Robot>

Figure 9:
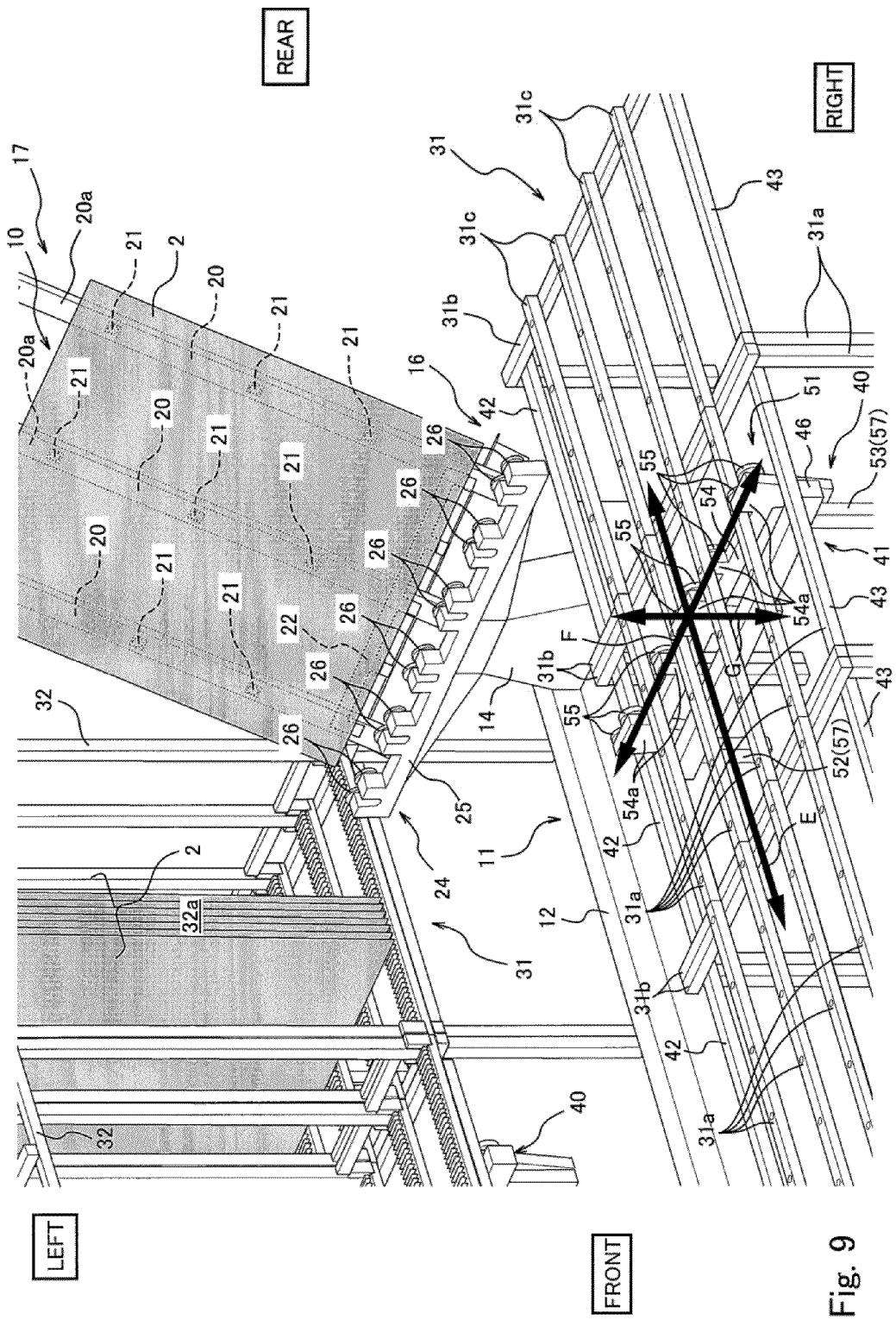
FIG. 9 is a perspective view showing in an enlarged manner a rack robot of the stocker facility shown in FIG. 3.
Figure 10:
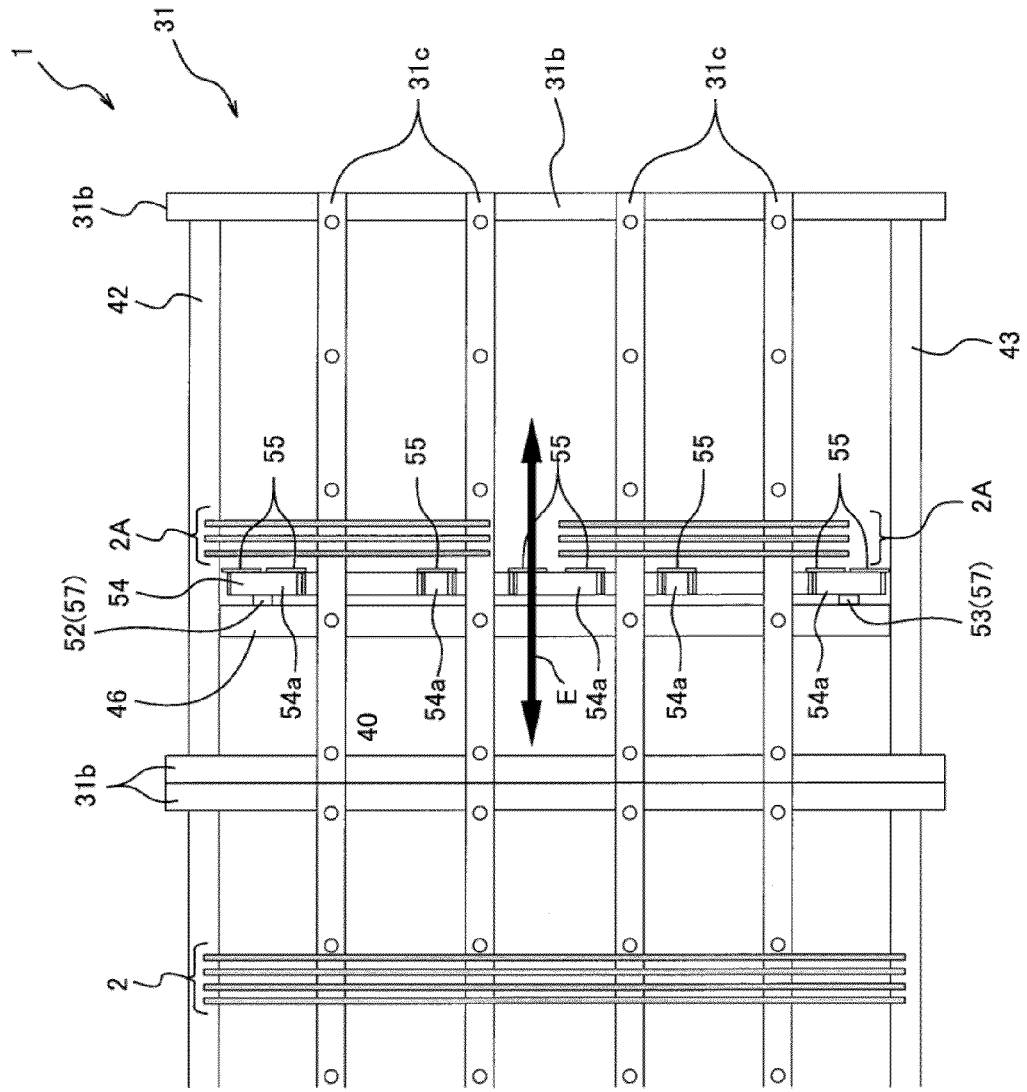
FIG. 10 is an enlarged plan view of the rack robot shown in FIG. 9, which is seen from above.

Each rack robot 40 is as shown in FIG. 4 and FIG. 9. One rack robot 40 is provided at the left side and the other rack robot 40 is provided at the right side, and each rack robot 40 includes a rack-side moving mechanism 41. The rack-side moving mechanism 41 includes a pair of guide rails 42 and 43. The pair of rails 42 and 43, extending in the front-rear direction, span between the two beam members 31*b* of each rack base 31. The pair of rails 42 and 43 are fixed to the lower surfaces of the beam members 31*b*, and are positioned at the left and right ends of the beam members 31*b*, such that the rails 42 and 43 are spaced apart from each other. The pair of rails 42 and 43 can be extended by connecting the pair of rails 42 and 43 of one rack base 31 to the pairs of rails 42 and 43 of the adjacent rack bases 31 positioned at the front and rear of the one rack base 31. Accordingly, by arranging a plurality of rack bases 31 in a line, the pairs of rails 42 and 43 of the plurality of rack bases 31 form a pair of linear motion guides 44 and 45 which extend in the front-rear direction through the plurality of rack bases 31. A rack-side running base 46 is attached to the pair of linear motion guides 44 and 45 so as to span between the pair of linear motion guides 44 and 45.

The rack-side running base 46 includes a running base body 47 which is formed to be long from side to side in the left-right direction. Slide blocks 48 and 49 are provided at the left and right ends of the running base body 47, respectively. The pair of slide blocks 48 and 49 are attached to the pair of linear motion guides 44 and 45, respectively, such that the pair of slide blocks 48 and 49 are slidable in the front-rear direction. By means of the pair of slide blocks 48 and 49, the running base body 47 can slide in the front-rear direction (see arrow E in FIG. 9) between the front and rear ends of the plurality of rack bases 31 which are arranged in a line. It should be noted that the left and right ends of the running base body 47 are formed so as not to come into contact with the rack bases 31 when sliding in the front-rear direction.

The rack-side moving mechanism 41 includes a rack-side slide actuator 50 (see FIG. 5) configured to cause the pair of slide blocks 48 and 49 to slide. The rack-side slide actuator 50 includes a rack-and-pinion mechanism and a servomotor, for example. A rack gear (not shown) is provided at the one linear motion guide 44, and a pinion gear (not shown) is provided at the one slide block 48 which corresponds to the one liner motion guide 44. The servomotor is provided within the one slide block 48, and is configured to rotate the pinion gear. When the pinion gear is rotated by means of the servomotor, the pinion gear rolls on the rack gear in the front-rear direction, and accordingly, the slide blocks 48 and 49 slidingly move forward or backward on the linear motion guides 44 and 45. That is, by driving the servomotor, the rack-side running base 46 can be caused to slide in the front-rear direction. The rack-side running base 46, which slides in the above manner, includes a rack-side conveyance mechanism 51 attached thereto.

The rack-side conveyance mechanism 51 includes a pair of lifting/lowering rails 52 and 53. The pair of lifting/lowering rails 52 and 53 are linear rails extending in the up-down direction, and are provided at the left and right ends of the main body of the base 46, respectively, such that the lifting/lowering rails 52 and 53 are spaced apart from each other. Slider blocks, which are not shown, are attached to the pair of lifting/lowering rails 52 and 53, respectively, such that the slider blocks are slidable in the up-down direction. Further, a rack-side conveyance base 54 is provided via the slider blocks.

The rack-side conveyance base 54 is a plate-shaped member which is long from side to side in the left-right direction. The aforementioned slider blocks are fixed to the left and right ends of the rack-side conveyance base 54, respectively. When seen in plan view, the rack-side conveyance base 54 is positioned between the pair of linear motion guides 44 and 45. The rack-side conveyance base 54 slides in the front-rear direction together with the rack-side running base 46. A plurality of attachment portions 54a are provided at the upper portion of the rack-side conveyance base 54. When seen in plan view, the attachment portions 54a are positioned so as not to overlap the cross-girders 31c of the rack base 31. The rack-side conveyance base 54 is configured such that, when the rack-side conveyance base 54 is lifted, each attachment portion 54a protrudes upward between cross-girders 31c, or protrudes upward at the side (left or right side) of its adjacent cross-girder 31c. Rollers 55 each serving as a driving member are attached to the attachment portions 54a.

The rollers 55 are attached to the rear of the rack-side conveyance base 54 in an interspaced manner. In the present embodiment, eight rollers 55 are attached to the rack-side conveyance base 54. It should be noted that the driving member may be realized not by the rollers 55 but by a belt. For example, pulleys may be provided instead of the rollers 55, and the driving member may be realized by stretching a belt around the two or more pulleys.

Similar to the rollers 26 of the track-side conveyance base 25, the rollers 55 are each configured to be rotatable around a rotation axis extending in the front-rear direction. A rack-side roller actuator 56 is provided within the track-side conveyance base 25 (see FIG. 5). For example, the rack-side roller actuator 56 includes a transmission mechanism and a servomotor. The transmission mechanism is configured as a timing belt, for example. The rack-side roller actuator 56 is configured to rotate the plurality of rollers 55 in conjunction with each other in the same direction. The rack-side roller actuator 56 thus configured forms a rack-side sending part together with the rollers 55. The rack-side sending part can send a glass plate 2 placed on the rollers 55 to the left or right by rotating the rollers 55 (see arrow F in FIG. 9).

The rack-side conveyance base 54 further includes a rack-side lifting/lowering mechanism 57. The rack-side lifting/lowering mechanism 57 includes: the above-described pair of lifting/lowering rails 52 and 53; the slider blocks (not shown) attached to the lifting/lowering rails 52 and 53; and a rack-side lifting/lowering actuator 58 (see FIG. 5) including, for example, a ball screw mechanism and a servomotor. The rack-side lifting/lowering mechanism 57 is configured to lift and lower the rack-side conveyance base 54. The rack-side conveyance base 54 is configured to be lifted and lowered between a conveyance position and a standby position (see arrow G in FIG. 9). When the rack-side conveyance base 54 is at the conveyance position, the upper surfaces of the rollers 55 are positioned higher than the top end of the beam members 31b and the top end of the cross-girders 31c. When the rack-side conveyance base 54 is at the standby position, the rollers 55 are positioned entirely lower than the top end of the beam members 31b and the top end of the cross-girders 31c. It should be noted that, when the rack-side conveyance base 54 is at the conveyance position, the upper surfaces of the rollers 26 of the track-side conveyance base 25 (i.e., the face of the track-side sending part), and the upper surfaces of the rollers 55 of the rack-side conveyance base 54 (i.e., the face of the rack-side sending part), are positioned on substantially the same plane.

As shown in FIG. 5, the rack robots 40 thus configured are provided with a rack controller 59 configured to control the operations of the actuators 50, 56, and 58 included in each rack robot 40. The rack controller 59 is a control block forming part of the control device 29 included in the stocker facility 1. The rack controller 59 is connected to the rack-side slide actuator 50, the rack-side roller actuator 56, and the rack-side lifting/lowering actuator 58 via signal wiring. The rack controller 59 has a function of controlling the operations of the actuators 50, 56, and 58 by sending signals to the actuators 50, 56, and 58 based on a program prestored in the storage unit 29a of the control device 29 and commands inputted via the input device 30. It should be noted that, in the present embodiment, the rack controller 59 is configured such that the rack controller 59 can control the components of one rack robot 40 disposed at the left side and control the components of the other rack robot 40 disposed at the right side in a manner where these controls are performed independently of each other.

<Sensors>

Figure 11A:
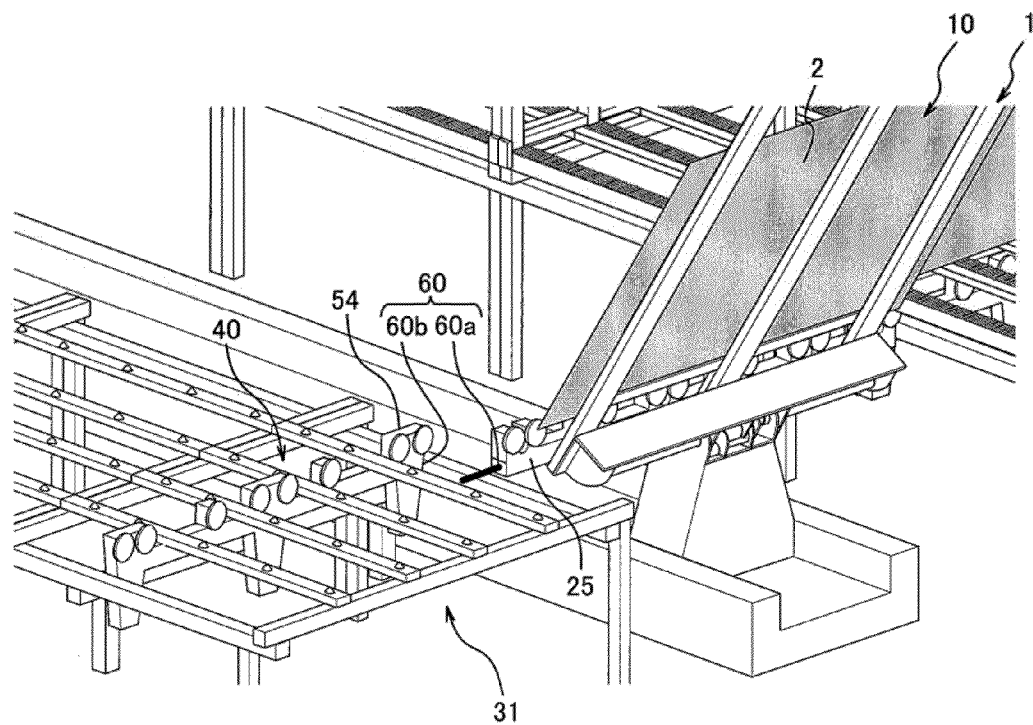
FIGS. 11A and 11B are rear perspective views showing sensors interacting between the rack robot and a stocker.
Figure 11B:
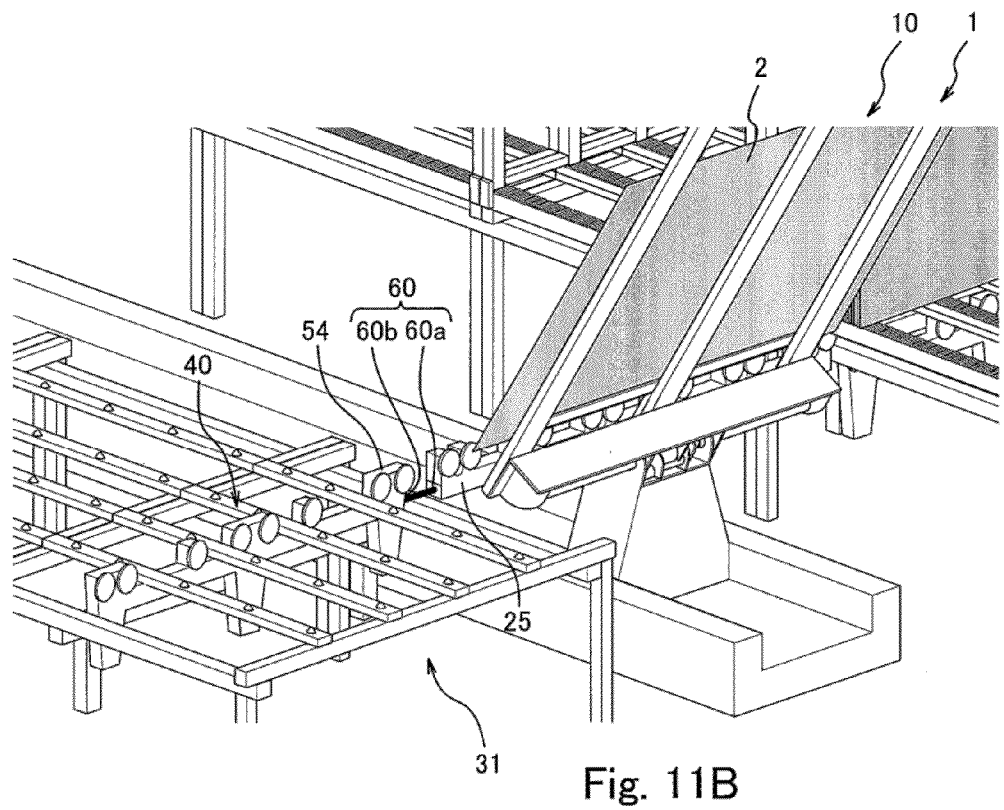

The track robot 10 and the rack robots 40 thus configured include sensors 60 as shown in FIGS. 11A and 11B. For example, each sensor 60 is configured as a pair fiber sensor including a light emitter 60a and a light receiver 60b. The light emitter 60a of one sensor 60 and the light emitter 60a of the other sensor 60 are, for example, attached to the left end face and the right end face of the track-side conveyance base 25, respectively. Each light receiver 60b is, for example, attached to a respective one of the rack-side conveyance bases 54 at the left or right end face that faces the track-side conveyance base 25.

The light emitters 60a and the light receivers 60b thus attached are configured such that, when the rollers 26 and 55 attached to the base 25 and one base 54 are aligned with each other, the light receiver 60b of the one base 54 receives light emitted from the corresponding light emitter 60a (FIG. 11B), but when the rollers 26 and 55 attached to the base 25 and the one base 54 are not aligned with each other, the light receiver 60b of the one base 54 cannot receive light emitted from the corresponding light emitter 60a (see FIG. 11A). The light emitters 60a and the light receivers 60b are connected to the control device 29 via signal wiring. The control device 29 is configured to control the operations of the light emitters 60a and to receive outputs from the light receivers 60b. It should be noted that the sensors 60 are not limited to pair fiber sensors, but may be reflection fiber sensors.

The track robot 10, the racks 32, and the rack robots 40 are further provided with other various sensors which are not shown. Examples of such sensors include: a sensor configured to detect the position of a glass plate 2 to be transferred to the track robot 10; and a sensor configured to detect which position in a rack 32 a glass plate 2 is stored. These sensors may be realized as reflection fiber sensors, for example.

The track robot 10 and the rack robots 40 having the above-described configuration are configured to transfer glass plates 2 through the insertion openings 32a of the racks 32. Hereinafter, a description is given with reference to FIG. 1. FIG. 3, FIG. 5, and FIG. 12 to FIG. 22 regarding operations of the track robot 10 and one rack robot 40 that are performed when a glass plate 2 moving on the wheel conveyor 3 is stored into a rack 32 and when the glass plate 2 stored in the rack 32 is carried out of the rack 32. It should be noted that, similar to FIG. 3, the drawings of FIG. 11A and thereafter show states where the racks 32 on the right side are removed from the respective rack bases 31.

<Glass Plate Storing Operation>

Figure 12:
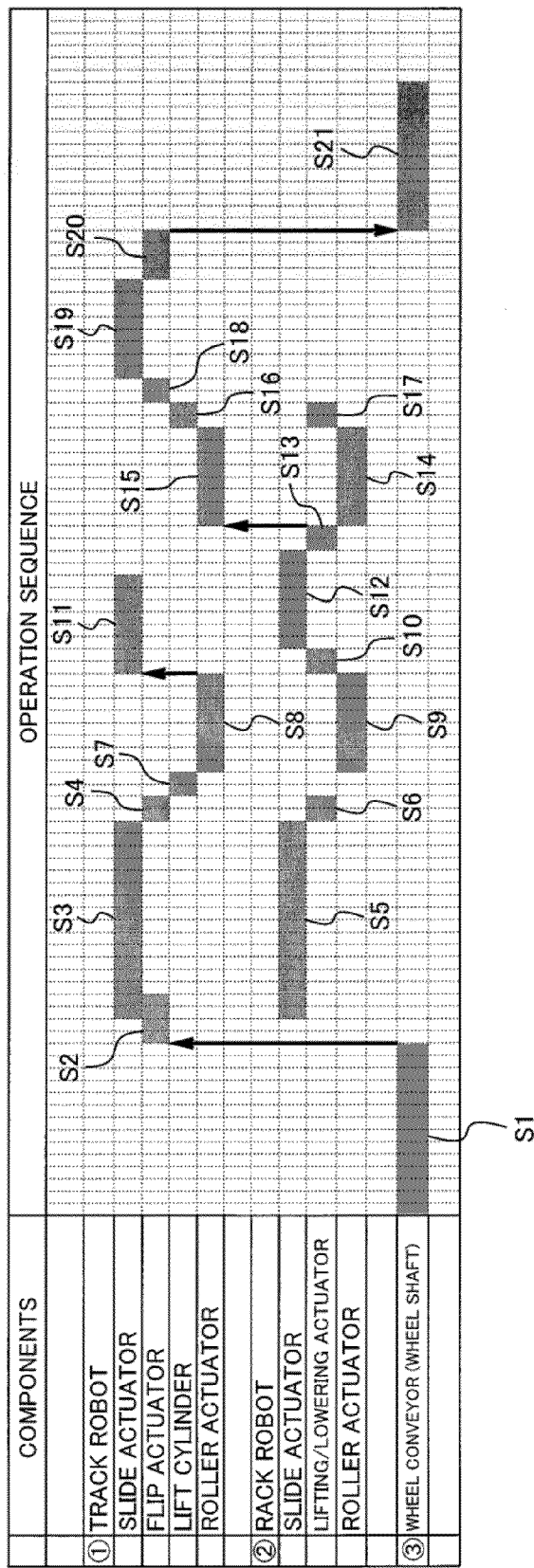
FIG. 12 is an operation sequence diagram showing control steps that are performed at the time of carrying-in and carrying-out of glass plates.
Figure 13:
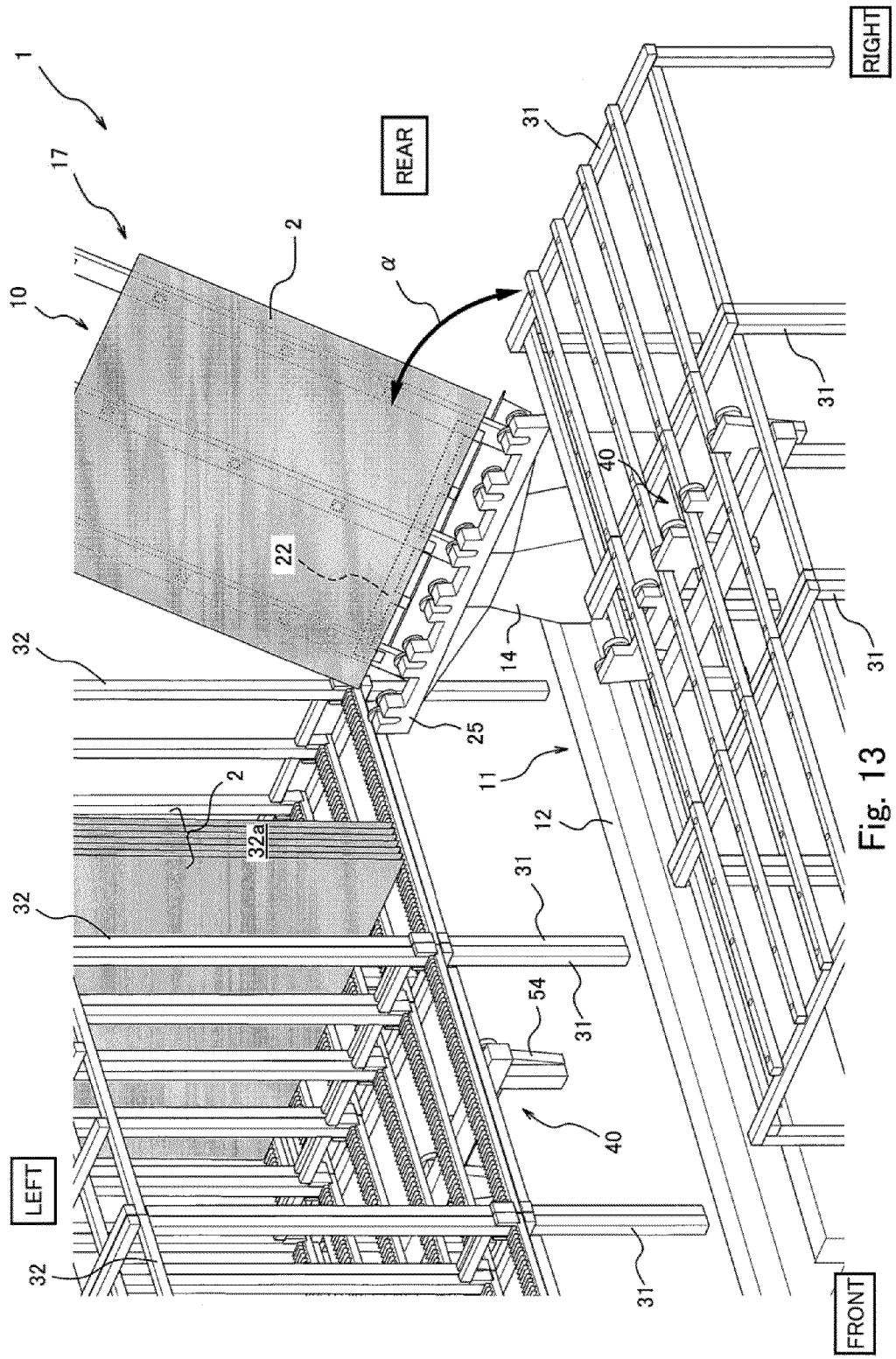
FIG. 13 is a perspective view showing in an enlarged manner a state where a flip has been raised from the state shown in FIG. 1.

FIG. 12 shows an operation sequence diagram in a case where the control device 29 controls the operations of the track robot 10 and one rack robot 40. At the leftmost side of the diagram, the column COMPONENTS indicates the actuators of the robots 10 and 40. The column OPERATION SEQUENCE at the right side of the diagram indicates an operation sequence of the components. That is, in the column OPERATION SEQUENCE, actuators to be driven are colored at respective driving timings. Hereinafter, operations of the track robot 10 and the rack robot 40 that are performed at the time of storing and retrieving glass plates 2 are described with reference to the operation sequence diagram.

First, prior to performing the control indicated by the operation sequence diagram, the track controller 28 of the control device 29 drives the track-side slide actuator 13 and the flip actuator 18 to cause the flip 17 to be in the horizontal orientation and stand by below the stop position of the wheel conveyor 3. The track robot 10 in this state awaits a glass plate 2 moving on the wheel conveyor 3. To be more specific, the control device 29 controls the operation of the track-side slide actuator 13 to move the track-side running base 14 of the track robot 10 to the vicinity of the wheel conveyor 3. After the track-side running base 14 is moved to the vicinity of the wheel conveyor 3, the control device 29 controls the operation of the flip actuator 18 to lay down the flip 17 backward. At the time, each of the three support plates 20 of the flip 17 comes between wheel shafts 5, so that the spherical rollers 21 of the flip 17 become flash with or positioned lower than the rollers of the wheel shafts. Then, by means of a controller for the conveyor which is not shown, the wheel conveyor 3 causes the stoppers 6 to protrude and drives the wheel shafts 5 (step S1), and awaits a glass plate 2 moving on the wheel conveyor 3 to reach the stop position.

When the glass plate 2 moving on the wheel conveyor 3 is stopped at the stop position by the stoppers 6 (see FIG. 1), the wheel conveyor 3 stops driving the wheel shafts 5. In response, the track controller 28 drives the flip actuator 18 to raise the flip 17 forward (step S2). As a result that the flip 17 standing by below the stop position is raised, the glass plate 2 is placed on the flip 17. Then, the glass plate 2 rises up as the flip 17 is further raised. At the time, the support 22 of the flip 17 supports the lower end of the glass plate 2 from below, which prevents the glass plate 2 from falling off the flip 17.

Next, the track controller 28 continues to cause the flip 17 to be raised with the lower end of the glass plate 2 supported by the support 22. When the flip 17 has rotated by an angle α from the horizontal state (see FIG. 13), the track controller 28 temporarily stops the operation of the flip actuator 18. It should be noted that the angle α is an angle at which the glass plate 2 is not upright. The angle α is set to such an angle as to cause the support plates 20 of the flip 17 to, at least, move out from between the wheel shafts 5 and become positioned above the wheel shafts 5. By setting the angle α to such an angle, the amount of wind caused by the glass plate 2 when the glass plate 2 is moved as described below can be reduced. In this manner, the amount of wind applied to glass plates 2 stored in the racks 32 can be reduced, and fluttering of the moving glass plate 2 can be suppressed.

Figure 14:
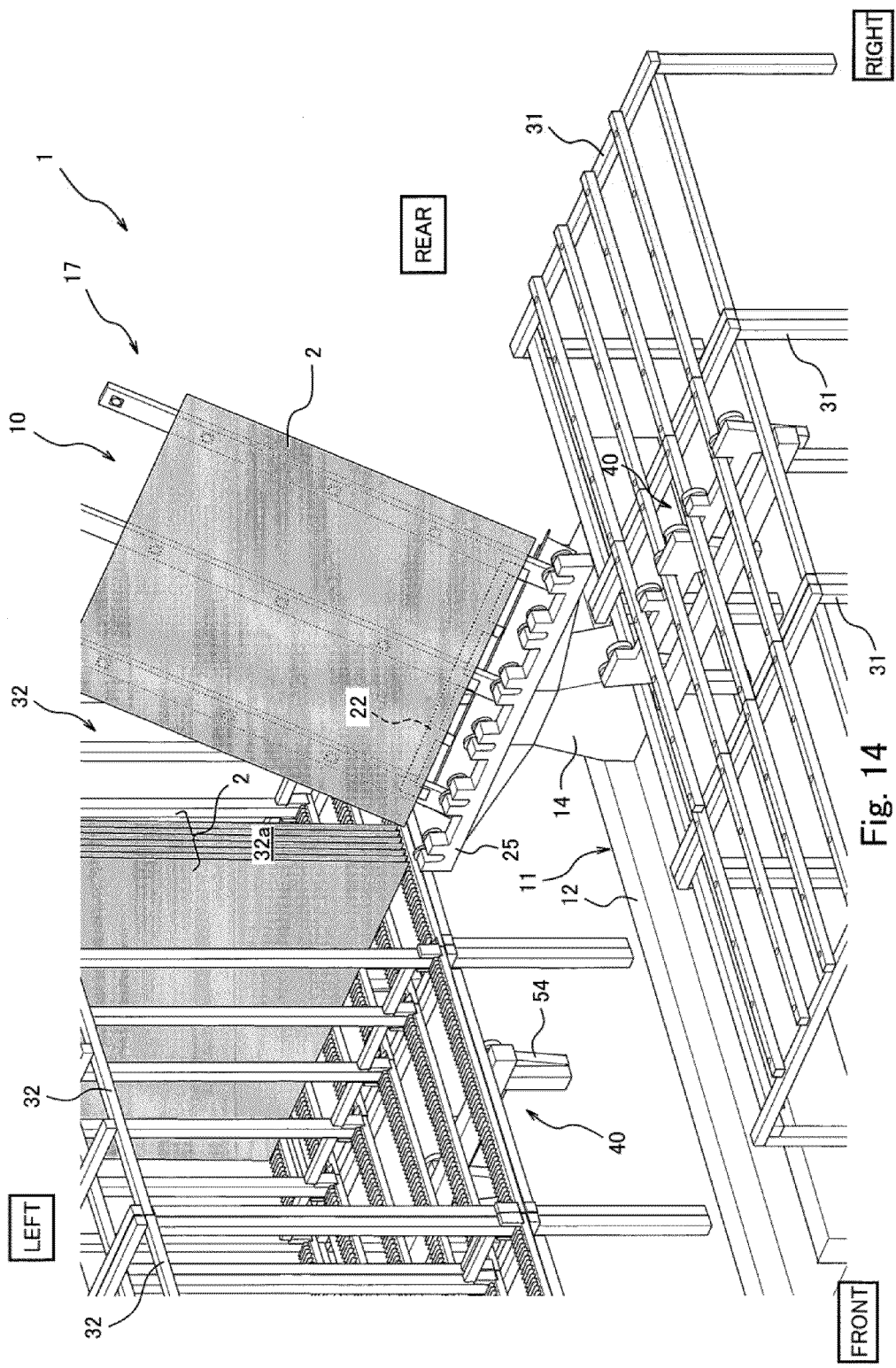
FIG. 14 is a perspective view showing in an enlarged manner a state where the stocker has been moved to the front of a storage position of a rack from the state shown in FIG. 13.
Figure 15:
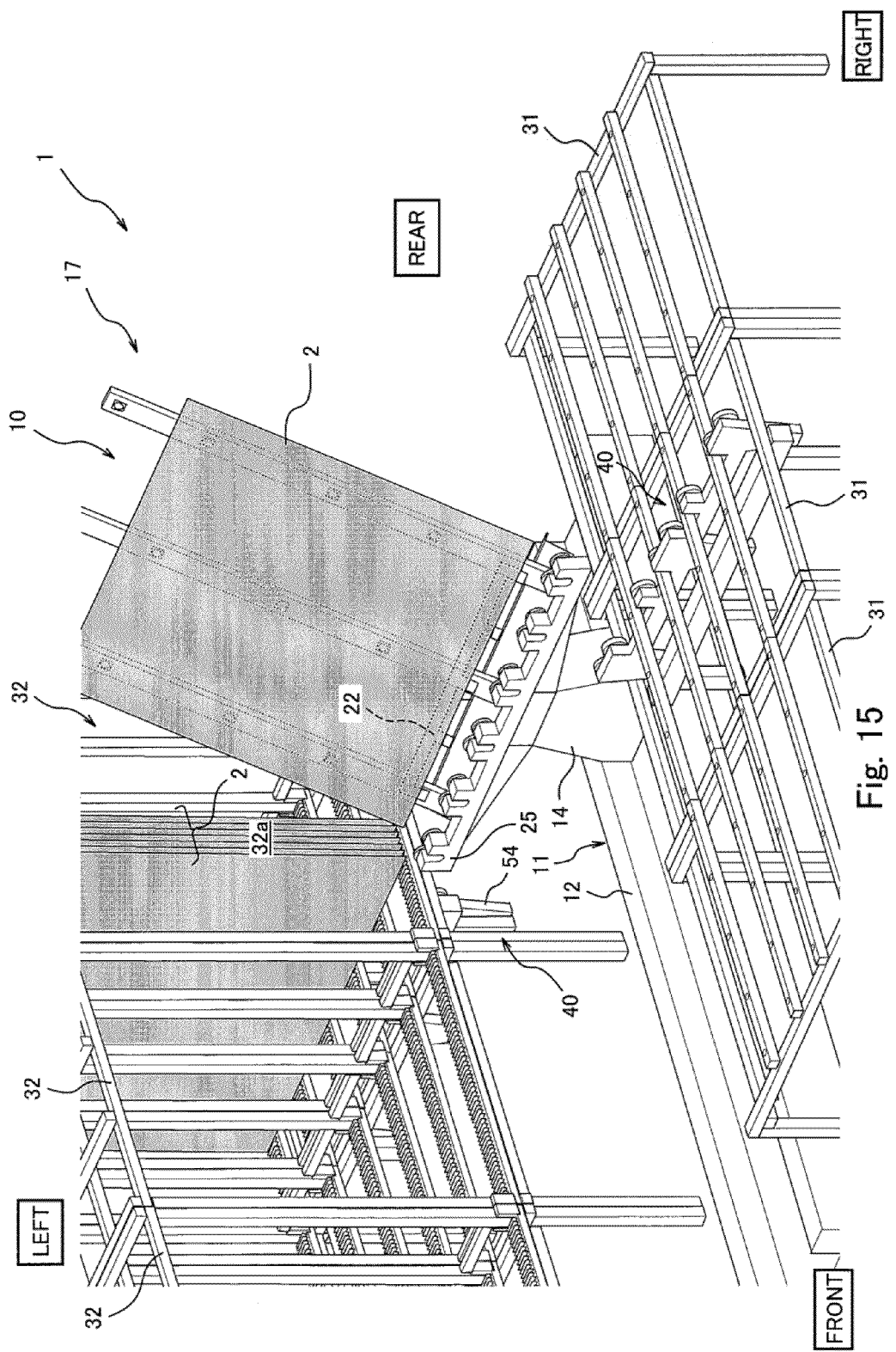
FIG. 15 is a perspective view showing in an enlarged manner a state where the rack robot has been moved to the storage position of the rack from the state shown in FIG. 14.
Figure 16:
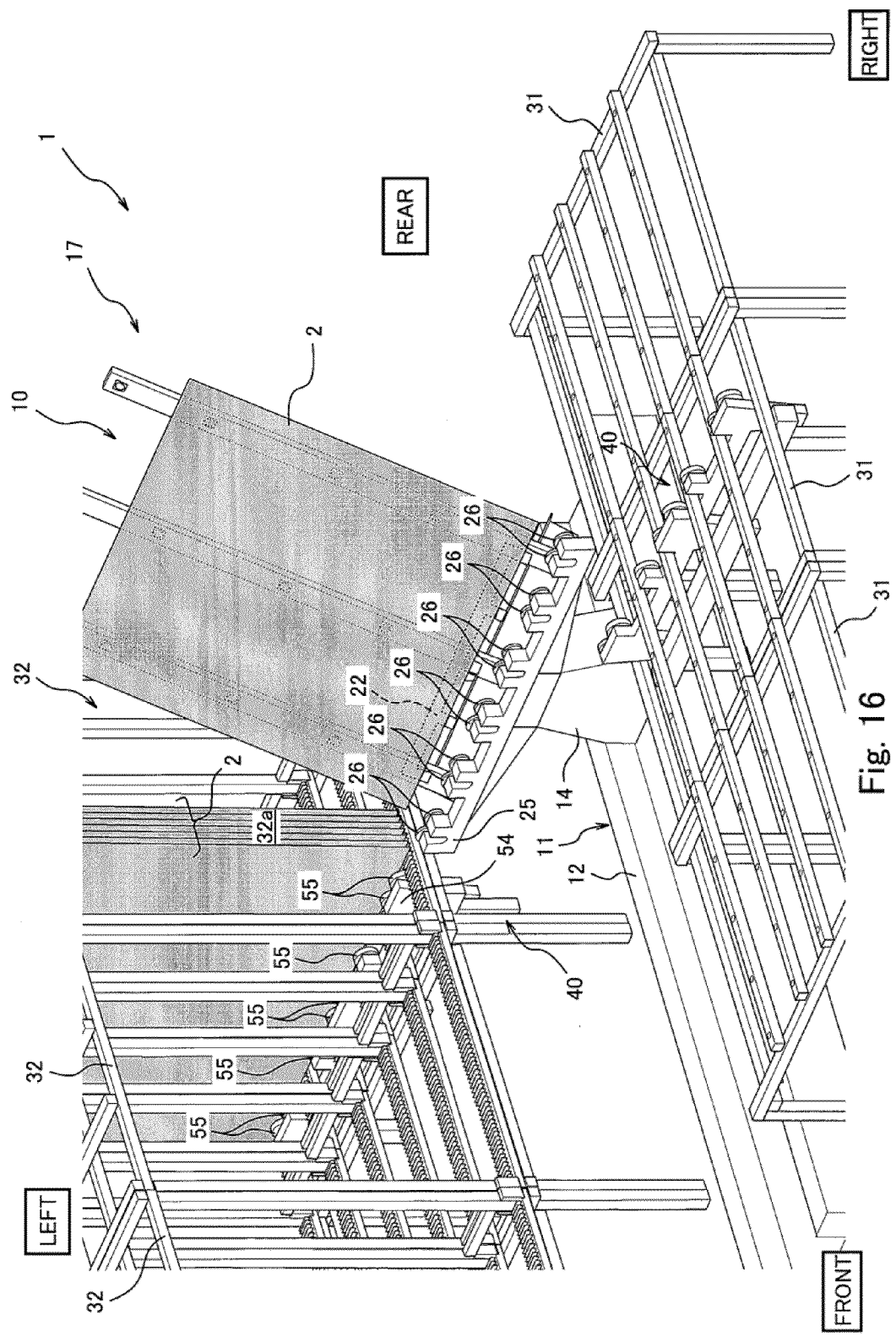
FIG. 16 is a perspective view showing in an enlarged manner a state where the rack robot has been lifted to a conveyance position from the state shown in FIG. 15.
Figure 17:
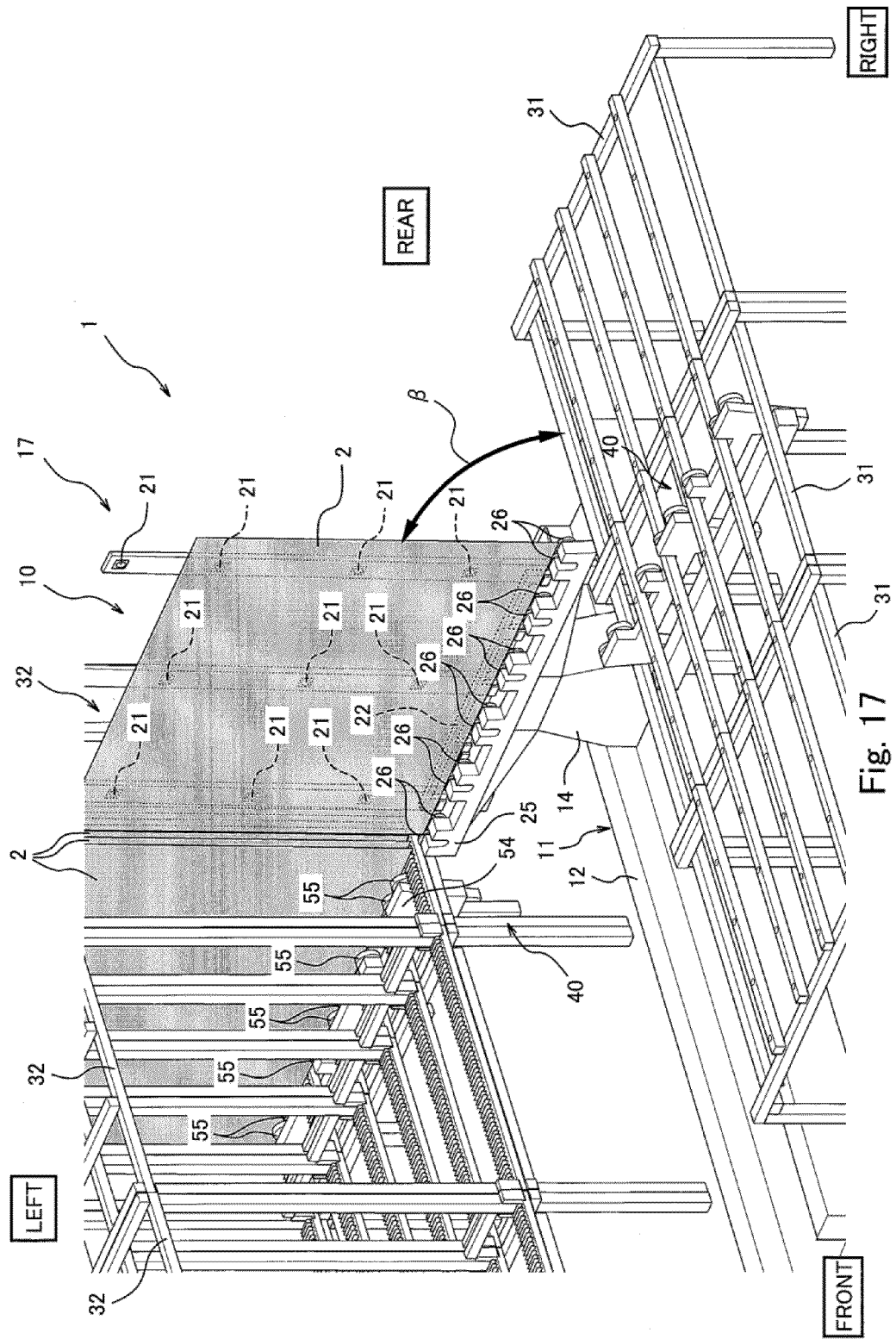
FIG. 17 is a perspective view showing in an enlarged manner a state where the flip has been raised from the state shown in FIG. 16 to become substantially vertical.
Figure 18:
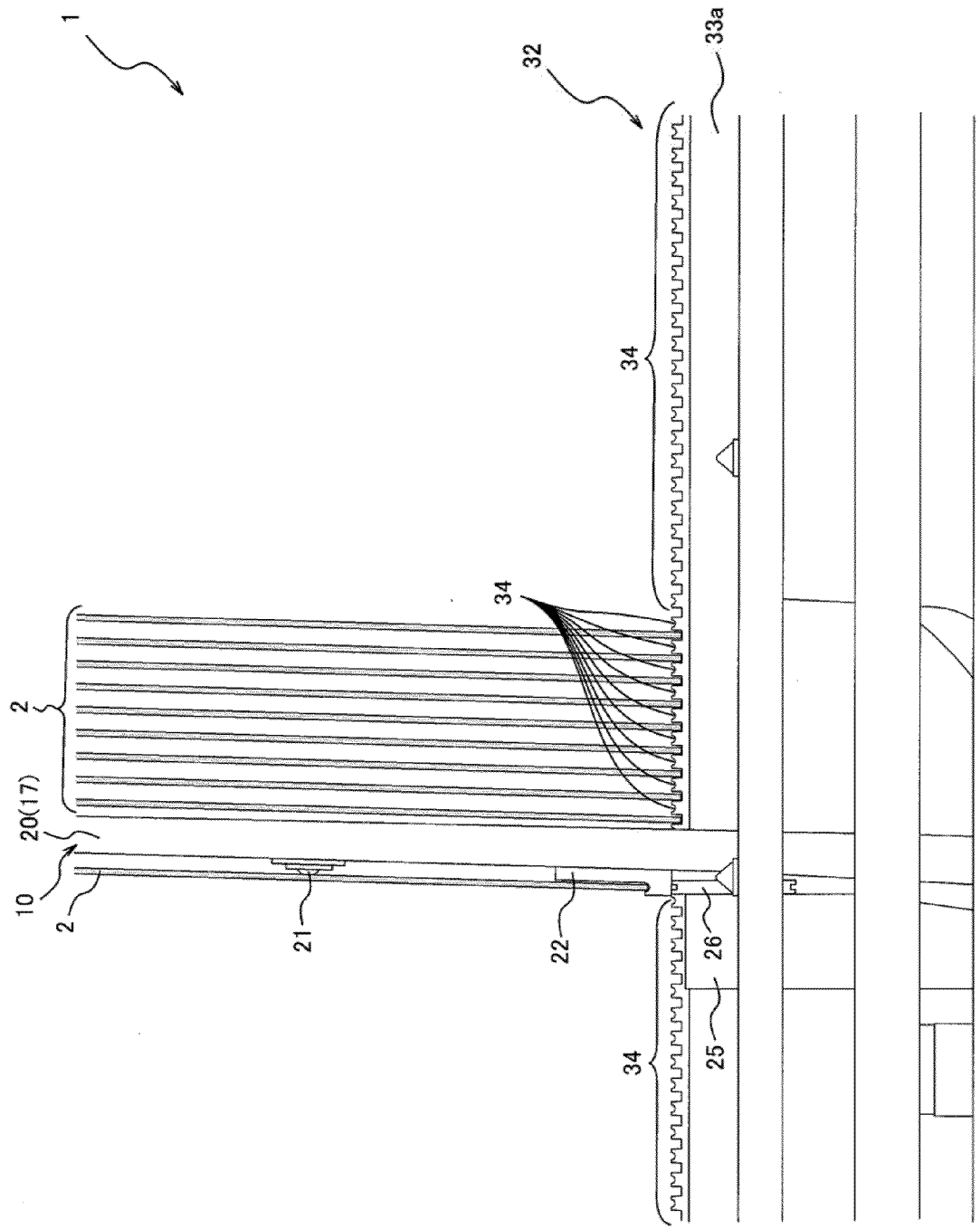
FIG. 18 is a right side view showing in an enlarged manner the stocker facility in the state shown in FIG. 17, which is seen from the right side.
Figure 19:
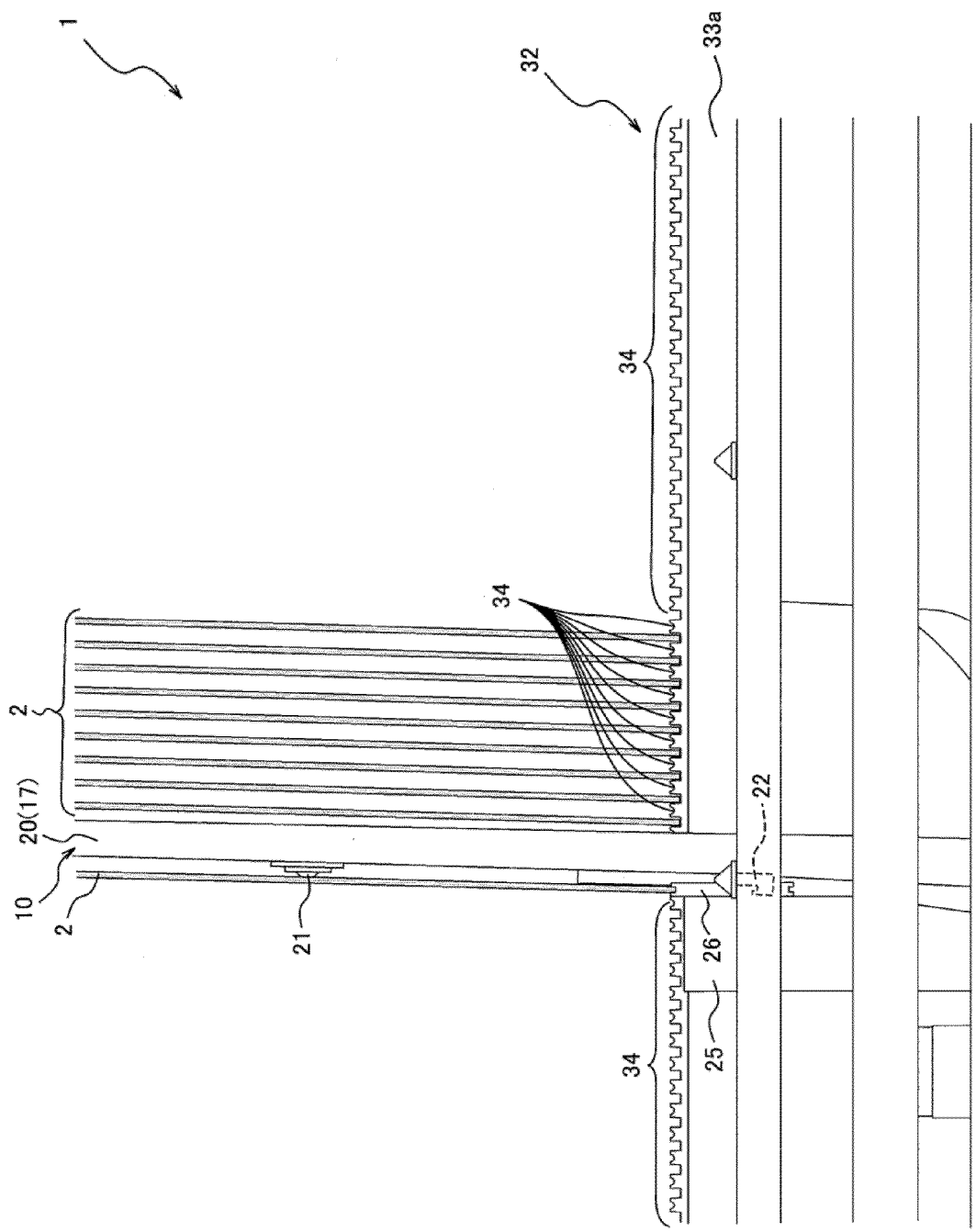
FIG. 19 is a right side view showing a state where a support has been lowered from the state shown in FIG. 18.
Figure 20:
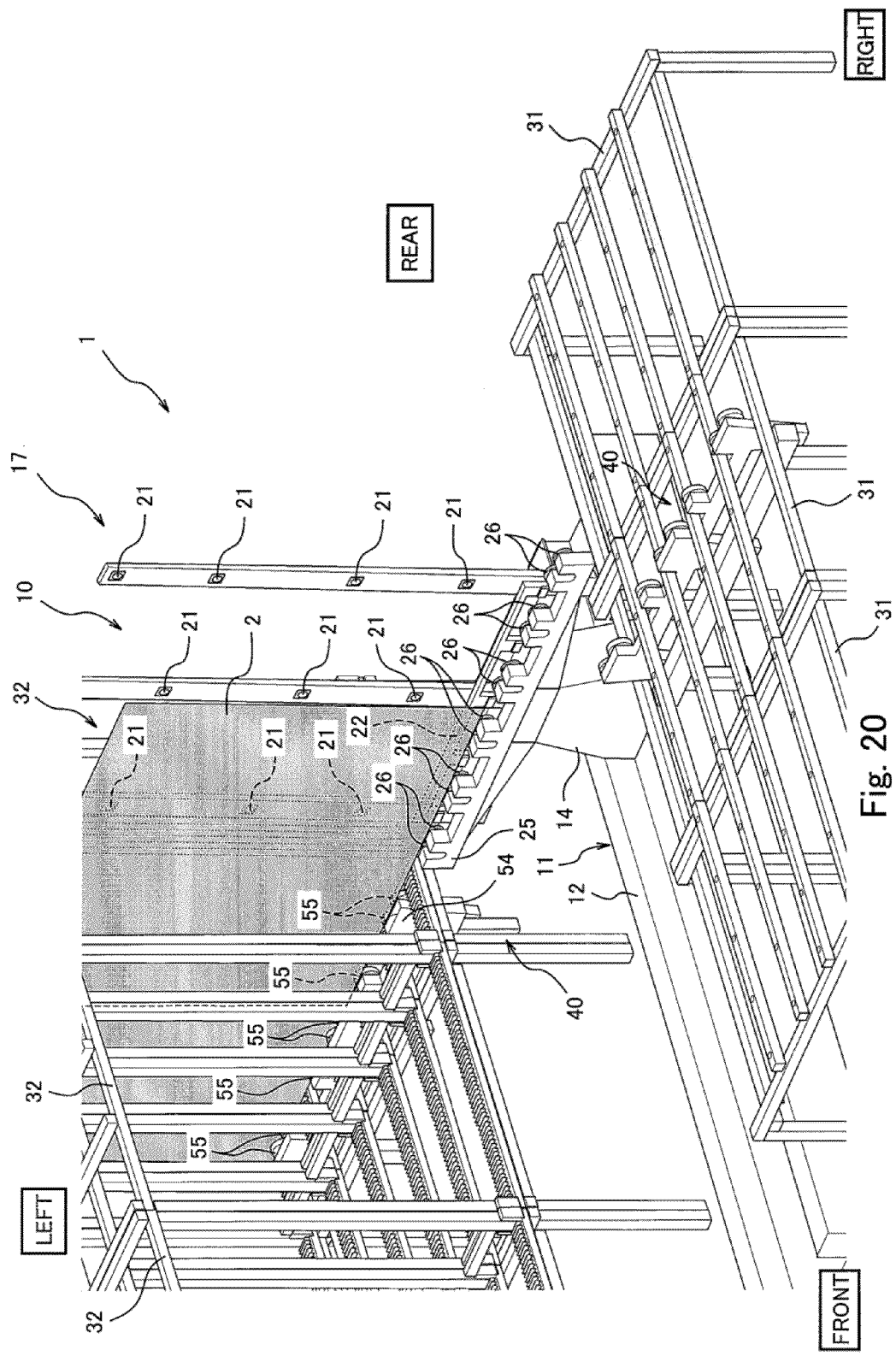
FIG. 20 is a perspective view showing in an enlarged manner a state where a glass plate has been slidingly moved from the state shown in FIG. 19 and thereby partially transferred onto the rack robot.
Figure 21:
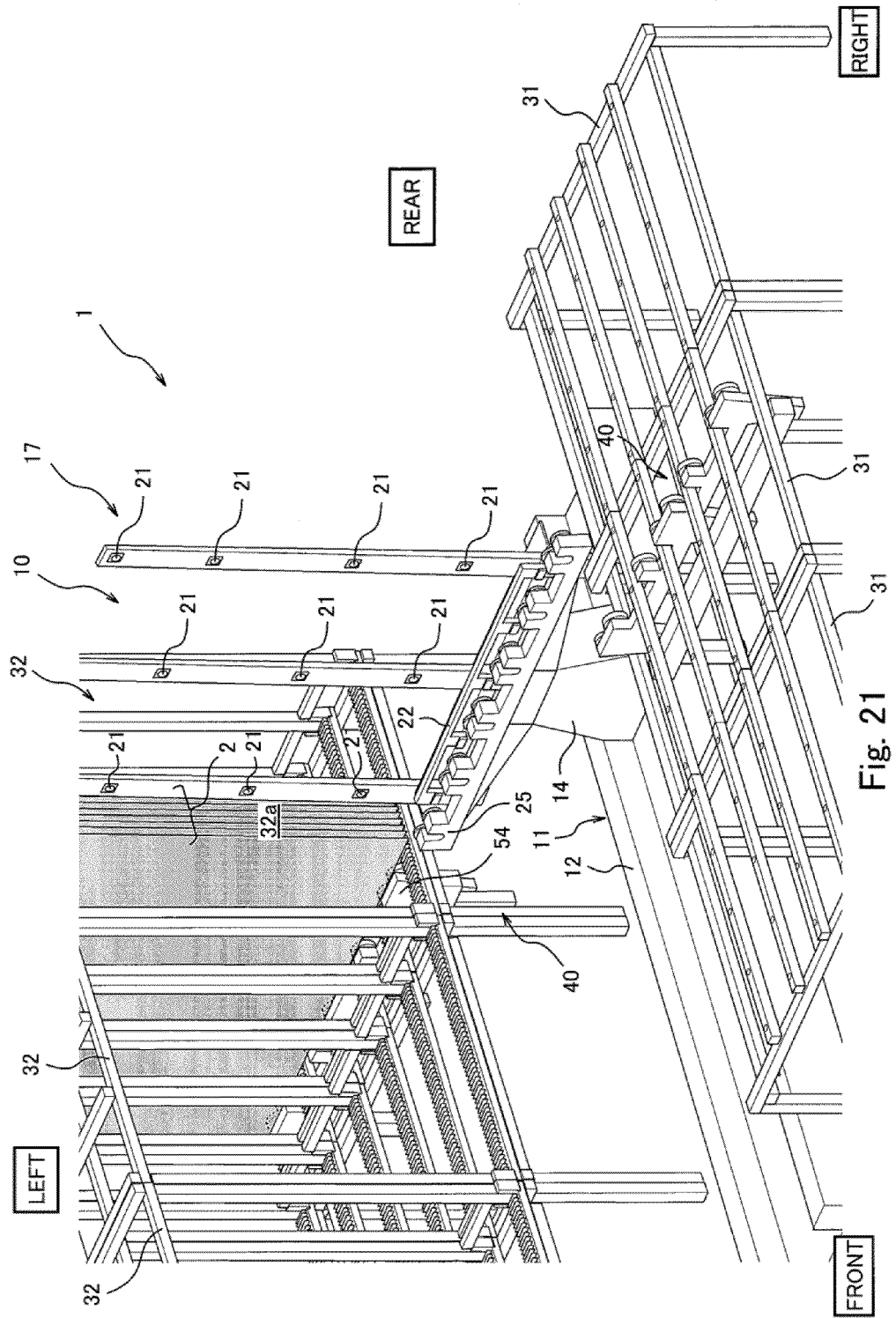
FIG. 21 is a perspective view showing in an enlarged manner a state where the glass plate has been moved to the storage position of the rack from the state shown in FIG. 20.
Figure 22:
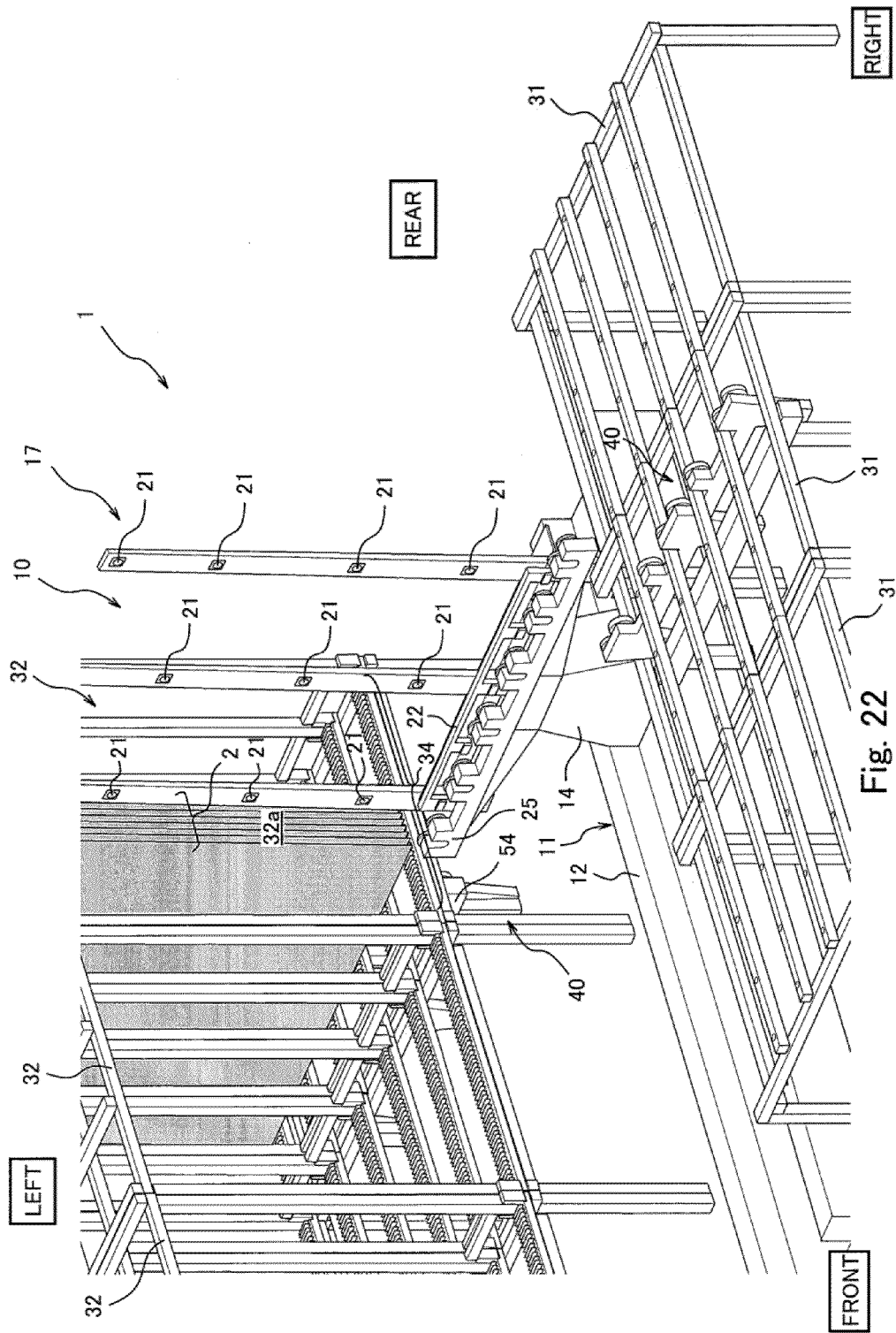
FIG. 22 is a perspective view showing in an enlarged manner a state where the glass plate has been lowered from the state shown in FIG. 21 and thereby stored in the rack.

When the flip 17 has moved out from between the wheel shafts 5 and become positioned above the wheel shafts 5, the track controller 28 drives the track-side slide actuator 13 in parallel with step S2 to move the track-side running base 14 forward (step S3). The track controller 28 causes the track-side running base 14 to move to the front of a storage position, and then stops the operation of the track-side slide actuator 13 (FIG. 14). The storage position herein is a position in a rack 32, at which position the glass plate 2 placed on the flip 17 is to be stored. The storage position is predetermined for each glass plate 2. For example, the storage position of each glass plate 2 is obtained by reading identification information of the glass plate 2 from an identifier such as a QR code or non-contact IC attached to the glass plate 2.

When the track-side conveyance base 25 reaches the front of the storage position, the track controller 28 drives the flip actuator 18 to further raise the flip 17, which has previously rotated by the angle α before the track-side conveyance base 25 reaching the front of the storage position (step S4). The track controller 28 causes the flip 17 to rotate until the rotation angle becomes an angle β at which the flip 17 is substantially vertical, so that the glass plate 2 is raised to be substantially vertical (see FIG. 17). It should be noted that the angle β is set within a range not less than 85 degrees but less than 90 degrees. However, the angle β is not limited to be within this angular range.

In parallel with the above series of control by the track controller 28, the rack controller 59 controls the operation of the rack robot 40. Specifically, when the track controller 28 drives the track-side slide actuator 13, the rack controller 59 also drives the rack-side slide actuator 50 (step S5). As a result of the rack-side slide actuator 50 being driven, the rack-side conveyance base 54 previously lowered to the standby position (see FIG. 13 and FIG. 14) slidingly moves in the front-rear direction. The rack controller 59 causes the rack-side conveyance base 54 to move forward or backward toward the storage position. When the rack-side conveyance base 54 reaches the storage position, the rack controller 59 stops the operation of the rack-side slide actuator 50 (see FIG. 15).

Subsequently, the rack controller 59 drives the rack-side lifting/lowering actuator 58 (step S6). As a result of the rack-side lifting/lowering actuator 58 being driven, the rack-side conveyance base 54 is lifted, and when the rack-side conveyance base 54 reaches the conveyance position, the rack controller 59 stops the operation of the rack-side lifting/lowering actuator 58 (see FIG. 16). As a result, the track-side conveyance base 25 and the rack-side conveyance base 54 are aligned in the left-right direction, and the upper surfaces of the rollers 26 and 55 of the bases 25 and 54 are positioned on the same plane. The sensor 60 detects such a state where the rack-side conveyance base 54 and the track-side conveyance base 25 are aligned in the left-right direction, and transmits the detected state to the control device 29.

Upon receiving the detected state, the control device 29 determines that the rollers 26 and 55 of the bases 25 and 54 are aligned with each other. Based on the determination, the track controller 28 drives the lift cylinder 23 to lower the support 22 (step S7). Here, the support 22 is positioned away above the rollers 26 (see FIG. 18) so as to be at a higher elevation than the rollers 26 so that the glass plate 2 will not come into contact with the rollers 26 and the track-side conveyance base 25 when the track-side conveyance base 25 is moved. From this state, the track controller 28 drives the lift cylinder 23 to lower the support 22 slowly, so that the glass plate 2 is placed on the upper surfaces of the rollers 26. After the glass plate 2 is placed on the upper surfaces of the rollers 26, the track controller 28 causes the support 22 to be further lowered, so that the support 22 is removed from the glass plate 2 (see a dashed line in FIG. 19).

When the support 22 is removed from the glass plate 2, the track controller 28 causes the track-side roller actuator 27 to rotate the rollers 26 counterclockwise (step S8). When the rollers 26 rotate counterclockwise, the glass plate 2 placed on the upper surfaces of the rollers 26 is sent to the left. At the time, the glass plate 2 is leaning against the flip 17, and the glass plate 2 can be smoothly moved without causing the glass plate 2 to fall over forward or backward since the rear surface of the glass plate 2 is supported by the spherical rollers 21.

As the glass plate 2 is sent to the left, the glass plate 2 is inserted into the insertion opening 32a of the rack 32. Then, the upper end of the glass plate 2 is inserted between two adjacent guide rollers 35 (see FIG. 8A) of the top girder 33b that is provided near the insertion opening 32a of the rack 32 (i.e., the glass plate 2 is carried into the rack 32). As a result, the upper end of the glass plate 2 is supported by the guide rollers 35, and therefore, the glass plate 2 does not fall over when sent into the rack 32. Then, the glass plate 2 is further sent to the left, and as a result, the left side of the lower end of the glass plate 2 moves onto the rollers 55 of the rack-side conveyance base 54.

Similar to the track controller 28, the rack controller 59 causes the rack-side roller actuator 56 to rotate the rollers 55 counterclockwise (step S9). The rollers 26 and the rollers 55 synchronize with each other, and work together to send the glass plate 2 having moved onto the rollers 55 to the left (i.e., to the inner part of the rack 32) (see FIG. 20). In this manner, the glass plate 2 is further sent to the left, and as a result, the upper end of the glass plate 2 is inserted between the guide rollers 35 of the other top girders 33b one after another. The glass plate 2 is moved to the storage position while the upper end of the glass plate 2 is guided by the plurality of guide rollers 35. When the glass plate 2 reaches the storage position, the track controller 28 and the rack controller 59 stop the operations of the roller actuators 27 and 56, thereby stopping sending the glass plate 2 (see FIG. 21).

After stopping the operation of the rack-side roller actuator 56, the rack controller 59 drives the rack-side lifting/lowering actuator 58 to lower the rack-side conveyance base 54 (step S10). At the storage position, when seen in side view, the lower end of the glass plate 2 is positioned between two adjacent front and rear separators 34. When the rack-side conveyance base 54 is lowered, the lower end of the glass plate 2 is inserted between two adjacent separators 34 provided at each bottom girder 33a (see FIG. 8B). When the rack-side conveyance base 54 is further lowered, the lower end of the glass plate 2 is placed on the bottom girders 33a, accordingly (see FIG. 22). Thus, the glass plate 2 is stored in the rack 32 in a slightly inclined manner, such that the lower end of the glass plate 2 is supported by the bottom girders 33a from below whereas the upper end of the glass plate 2 is in a state of leaning against the guide rollers 35. It should be noted that the glass plate 2 stored in the rack 32 is inclined at an angle at which the glass plate 2 is inclined when transferred from the track robot 10 to the rack robot 40, that is, the glass plate 2 stored in the rack 32 is inclined at the same angle as the angle β of the flip 17.

After the glass plate 2 is placed on the bottom girders 33a, the rack-side lifting/lowering mechanism 57 drives the rack-side lifting/lowering actuator 58 to lower the rack-side conveyance base 54. When the rack-side conveyance base 54 has been lowered to the standby position such that all the rollers 26 are positioned below the bottom girders 33a, the rack controller 59 stops the operation of the rack-side lifting/lowering actuator 58, and prepares for the next retrieval or carrying-in of a glass plate 2.

<Glass Plate Retrieval Operation>

Next, operations of the track robot 10 and the rack robot 40 that are performed in the case of retrieving a glass plate 2 from a rack 32 (i.e., carrying a glass plate 2 out of a rack 32) are described with reference to FIG. 12 and other drawings. It should be noted that the carrying-out of a glass plate 2 is performed by reversely following the steps of the carrying-in of a glass plate 2. Therefore, the description below refers to FIG. 13 to FIG. 22 as drawings that show respective states of a glass plate 2 during the carrying-out of the glass plate 2.

In parallel to the rack controller 59 performing the control for lowering the rack-side conveyance base 54 and storing a glass plate 2, the track controller 28 drives the track-side slide actuator 13 to move the track-side conveyance base 25 to the front of the storage position of a glass plate 2 that is to be carried out (step S11). When the track-side conveyance base 25 reaches the front of the storage position, the track controller 28 stops the operation of the track-side slide actuator 13 (see FIG. 22). After causing the rack-side conveyance base 54 to return to the standby position, the rack controller 59 drives the rack-side slide actuator 50 to move the rack-side conveyance base 54 toward the storage position of the glass plate 2 that is to be carried out (step S12). When the rack-side conveyance base 54 reaches the storage position, the rack controller 59 stops the operation of the rack-side slide actuator 50 (see FIG. 22).

Subsequently, the rack controller 59 drives the rack-side lifting/lowering actuator 58 to lift the rack-side conveyance base 54 (step S13). When seen in plan view, the rollers 55 of the rack-side conveyance base 54 are positioned right below the lower end of the glass plate 2, and when the rack-side conveyance base 54 is lifted, the lower end of the glass plate 2 is placed on the upper surfaces of the rollers 55. The rack-side conveyance base 54 is further lifted to the conveyance position. As a result, the glass plate 2 placed on the bottom girders 33a is lifted from the bottom girders 33a and then the glass plate 2 moves out from between, and becomes positioned above, the separator 34 previously supporting the glass plate 2 to prevent the glass plate 2 from falling over and the adjacent separator 34. When the glass plate 2 has thus moved out from between the separators 34 and the rack-side conveyance base 54 has reached the conveyance position, the rack controller 59 stops the operation of the rack-side lifting/lowering actuator 58 (see FIG. 21).

When the rack-side conveyance base 54 reaches the conveyance position, and the rack-side conveyance base 54 and the track-side conveyance base 25 are aligned in the left-right direction, the sensor 60 detects such a state and transmits the detected state to the control device 29. Upon receiving the detected state, the control device 29 determines that the rollers 26 and 55 of the bases 25 and 54 are aligned with each other. Based on the determination, the rack controller 59 causes the rack-side roller actuator 56 to rotate the rollers 55 clockwise (step S14). Accordingly, the glass plate 2 is sent to the right while the upper end of the glass plate 2 is guided by the plurality of guide rollers 35, and then the right side of the glass plate 2 exits from the insertion opening 32a of the rack 32 to move onto the rollers 26 of the track-side conveyance base 25.

Similar to the rack controller 59, the track controller 28 causes the track-side roller actuator 27 to rotate the rollers 26 clockwise (step S15). The rollers 26 and the rollers 55 synchronize with each other, and work together to send the glass plate 2 having moved onto the rollers 26 to the right through the insertion opening 32a (i.e., to the front of the rack 32) (see FIG. 20).

The upper end of the glass plate 2 that is sent out to the right in the above manner sequentially moves out from between the guide rollers 35 and thereby loses the support for the upper end. However, since the flip 17 is raised and held at the angle β which is substantially the same as the angle at which the glass plate 2 that is sent out is held, a portion of the glass plate 2 that is sent out of the insertion opening 32a is supported in the same state by the spherical rollers 21 of the flip 17, and moves on the spherical rollers 21. Therefore, when the glass plate 2 is transferred from the rack-side conveyance base 54 to the track-side conveyance base 25, there is not a risk that the glass plate 2 falls over backward or leans to get twisted, which may cause damage.

The rollers 26 and the rollers 55 work together to send out the glass plate 2, and when the glass plate 2 is entirely placed on the track-side conveyance base 25 (i.e., entirely placed on the upper surfaces of the rollers 26) (see FIG. 19), the track controller 28 and the rack controller 59 stop the operations of the track-side roller actuator 27 and the actuator 56 to stop sending the glass plate 2. It should be noted that, for example, a sensor which is not shown (e.g., reflection fiber sensor) is provided at the track-side conveyance base 25, and the control device 29 is configured to determine, by means of the sensor, whether the glass plate 2 is entirely placed on the track-side conveyance base 25.

When the glass plate 2 is entirely placed on the track-side conveyance base 25, the track controller 28 drives the lift cylinder 23 to slowly lift the support 22 which is positioned below the upper surfaces of the rollers 26 (see FIG. 19) (step S16). When the support 22 is lifted, the lower end of the glass plate 2 is placed on the upper surfaces of the rollers 26, accordingly. When the support 22 is further lifted, the lower end of the glass plate 2 is removed from the upper surfaces of the rollers 26. When the lower end of the glass plate 2 becomes away from the upper surfaces of the rollers 26 by a particular distance, the track controller 28 stops the operation of the lift cylinder 23 (see FIGS. 17 and 18). While the support 22 is being lifted in this manner, the glass plate 2 leans on the flip 17 and is supported by the spherical rollers 21. In preparation for the next carrying-in of a glass plate 2, the rack controller 59 drives the rack-side lifting/lowering actuator 58 to lower the rack-side conveyance base 54 to the standby position (step S17).

After stopping the operation of the lift cylinder 23, the track controller 28 subsequently drives the flip actuator 18 to rotate the flip 17, so that the flip 17 becomes inclined backward (step S18). When the inclination angle of the flip 17 becomes the angle α (see FIG. 16), the track controller 28 stops the flip actuator 18. Then, the track controller 28 drives the track-side slide actuator 13 to move the track-side conveyance base 25 backward (step S19). When the track-side conveyance base 25 reaches the vicinity of the wheel conveyor 3, the track controller 28 stops the operation of the track-side slide actuator 13.

Subsequently, the track controller 28 drives the flip actuator 18 to lay down the flip 17 (step S20). When the flip 17 is laid down to be in the horizontal orientation, the support plates 20 of the flip 17 come between the wheel shafts 5, and the glass plate 2 supported by the flip 17 is placed at the stop position on the wheel conveyor 3. The track controller 28 stops the operation of the flip actuator 18 when the flip 17 is laid down to be in the horizontal orientation. When the glass plate 2 is placed on the wheel conveyor 3, the controller for the conveyor causes the protruding stoppers 6 to withdraw, and drives the wheel shafts 5 to move the glass plate 2 to the downstream side. Then, the operation sequence returns to step S1 in order to store the next glass plate 2 moving from the upstream side into the corresponding rack 32. In this manner, the carrying-in and carrying-out of glass plates 2 are performed repeatedly.

As described above, in the stocker facility 1, the glass plate 2 is transferred between the flip 17 and the rack 32 by means of the track-side conveyance base 25 and the rack-side conveyance base 54, and thus the glass plate 2 can be stored into the rack 32. During the transfer, the glass plate 2 is supported by the flip 17, and therefore, the glass plate 2 can be stored into the rack 32 in a raised state without laying down the glass plate 2. Also, the glass plate 2 stored in the rack 32 in the raised state can be transferred to the flip 17 by means of the track-side conveyance base 25 and the rack-side conveyance base 54, and thus the glass plate 2 can be retrieved from the rack 32.

As described above, the glass plate 2 is moved and transferred in the left-right direction by means of the track-side conveyance base 25 and the rack-side conveyance base 54. Therefore, unlike conventional art, it is not necessary to insert the track robot into the rack 32 at the time of carrying the glass plate 2 into or out of the rack 32. Accordingly, unlike conventional art, even if glass plates 2 are densely stored with narrow spacing among them in order to reduce the installation area of the stocker facility 1, a risk that an end effector comes into contact with a stored glass plate 2 to cause damage to the glass plate 2 is eliminated in the following situations: a situation where a glass plate 2 is additionally carried into between two glass plates 2; and a situation where a glass plate 2 is carried out from among a plurality of arranged glass plates 2. Therefore, the glass plates 2 can be carried into and out of the rack 32 securely and speedily.

In a case where the glass plate 2 is a solar panel or liquid crystal panel, various components are gathered at one surface of the glass plate 2. For this reason, the glass plate 2 can be touched only on the reverse side. In the stocker facility 1 according to the present embodiment, the track robot 10 raises the glass plate 2 moving on the wheel conveyor 3 by supporting the glass plate 2 from below, and moves the glass plate 2 in the raised state. Accordingly, the flip 17 does not touch the upper surface (or front surface) of the glass plate 2. Therefore, in the stocker facility 1, the glass plate 2 can be moved between the wheel conveyor 3 and the rack 32 while one surface is kept facing upward (or facing front). Thus, the glass plate 2 can be moved without causing damage to the components on the glass plate 2.

In the stocker facility 1 according to the present embodiment, robots for conveyance use different from the track robot 10 are provided at the rack 32 side. Therefore, it is not necessary to slide the track robot 10 to the left and right to insert the track robot 10 into the container part of the rack 32 or even into other parts. That is, it is not necessary to insert the track robot 10 into any part inside partition walls of the rack 32. Accordingly, a time for inserting the track robot 10 into the rack 32 can be eliminated, which makes it possible to reduce the time for carrying each glass plate 2 into or out of the rack 32.

Further, in the stocker facility 1 according to the present embodiment, lines of racks 32 are formed at the left and right sides of the track robot 10, respectively, and the rack robots 40 are provided at the respective lines of racks 32. The rack robots 40 are configured to operate independently of each other. For example, assume a case where a rack robot 40 is located at one rack 32, and a glass plate 2 is to be carried out of another rack 32 in the same line of racks 32. In this case, it is necessary for the rack-side conveyance base 54 to be temporarily lowered to the standby position, moved to the storage position, and then lifted again to the conveyance position. However, in a case where one glass plate 2 is to be carried into a rack 32 at the left side of the track robot 10 and thereafter another glass plate 2 is to be carried out of a rack 32 at the right side of the track robot 10, the rack robots 40 can be operated independently of each other to locate the right-side rack robot 40 at the storage position of the glass plate 2 to be carried out while the left-side rack robot 40 is performing a carry-in operation. In this manner, the time for carrying-out of the glass plate 2 can be reduced by the eliminated time for lifting, lowering, and moving the rack-side conveyance base 54.

Still further, in the stocker facility 1 according to the present embodiment, the track-side conveyance base 25 is lifted and lowered by the rack-side lifting/lowering actuator 58, and thereby the glass plate 2 can be positioned higher than the bottom girders 33a and the separators 34. Accordingly, at the time of carrying the glass plate 2 into or out of the rack 32, the glass plate 2 can be prevented from rubbing on the bottom girders 33a and the separators 34 while the glass plate 2 is moving. Thus, damage to the glass plate 2 or production of dust due to the rubbing can be prevented. Moreover, the glass plate 2 is lifted and lowered slowly at the storage position. Therefore, when the glass plate 2 is lowered, the glass plate 2 can be prevented from hitting the bottom girders 33a hard to become damaged, and also, when the glass plate 2 is lifted, the glass plate 2 can be prevented from hitting the rack-side conveyance base 54 hard to become damaged.

Still further, in the stocker facility 1 according to the present embodiment, when the rack-side conveyance base 54 is lifted to the conveyance position, the attachment portions 54a protrude between, and at the side of, the plurality of bottom girders 33a, so that the upper surfaces of the rollers 26 are positioned higher than the bottom girders 33a. As a result, the glass plate 2 can be moved smoothly in the left-right direction in the rack 32, and the glass plate 2 can be transferred smoothly between the rack 32 and the flip 17.

In the stocker facility 1 according to the present embodiment, the flip 17 supports the glass plate 2 by the plurality of spherical rollers 21. Therefore, when the glass plate 2 is slidingly moved by means of the rollers 26, the glass plate 2 may be slidingly moved with the glass plate 2 leaned against the flip 17. Even in such a manner, the glass plate 2 can be moved smoothly. Accordingly, when the glass plate 2 is transferred between the rack 32 and the flip 17, the glass plate 2 can be prevented from falling over. Moreover, if the glass plate 2 is slidingly moved directly on the support plates 20 of the flip 17, the glass plate 2 becomes damaged and dust is produced. However, the stocker facility 1 according to the present embodiment can prevent such problems.

Further, in the stocker facility 1 according to the present embodiment, the flip 17 and the track-side conveyance mechanism 24 can be moved together by means of the track-side running base 14. Therefore, positional alignment between the flip 17 and the track-side conveyance mechanism 24 is not necessary, and an operating program can be made simple, accordingly. Since the flip 17 and the track-side conveyance mechanism 24 can be moved together, the number of components can be reduced compared to a case where the flip 17 and the track-side conveyance mechanism 24 are moved separately. Therefore, the manufacturing cost can be reduced.

Although not shown in the drawings, a hinge lifting/lowering mechanism may be attached to the track-side running base 14 of the stocker facility 1 according to the present embodiment. The hinge 15 is attached to the track-side running base 14 via the hinge lifting/lowering mechanism. The hinge 15 is lifted and lowered by means of the hinge lifting/lowering mechanism. The hinge lifting/lowering mechanism lifts the hinge 15 until the upper surfaces 20a of the support plates 20 become positioned above the upper surface of the wheel conveyor 3, and lowers the hinge 15 until the upper surfaces 20a of the support plates 20 become positioned below the upper surface of the wheel conveyor 3.

Specifically, at the time of taking the glass plate 2 from the wheel conveyor 3, the hinge 15 may be lifted before rotating the flip 17. In this manner, the glass plate 2 can be placed onto the flip 17 without rotating the flip 17. On the other hand, at the time of placing the glass plate 2 onto the wheel conveyor 3, the hinge 15 may be lowered with the flip 17 set in the horizontal state. In this manner, the glass plate 2 can be placed onto the wheel conveyor 3. By placing and taking the glass plate 2 onto and from the wheel conveyor 3 in such a manner, the glass plate 2 can be kept in the horizontal state at the time of placing the glass plate 2 onto the flip 17, and the glass plate 2 can be prevented from becoming inclined at the time of placing and taking the glass plate 2 onto and from the wheel conveyor 3.

The stocker facility 1 according to the present embodiment is configured such that transfer of the glass plate 2 is not performed unless the sensor 60 detects that the track-side conveyance base 25 and the rack-side conveyance base 54 are aligned in the left-right direction. This makes it possible to prevent, for example, the following situations: a situation where the glass plate 2 is not properly transferred and thereby the glass plate 2 falls onto the bottom girders 33a and becomes damaged; and a situation where the glass plate 2 rubs on the bottom girders 33a to cause dust while moving.

Embodiment 2

A stocker facility 1A according to Embodiment 2 has a similar configuration to that of the stocker facility 1 according to Embodiment 1. Therefore, the description below regarding the configuration of the stocker facility 1A according to Embodiment 2 only describes differences from the configuration of the stocker facility 1 according to Embodiment 1. In Embodiment 2, the same configuration as that described in Embodiment 1 is denoted by the same reference signs as those used in Embodiment 1, and a description of such a common configuration is omitted. The same is true for Embodiment 3 and Embodiment 4.

Figure 23:
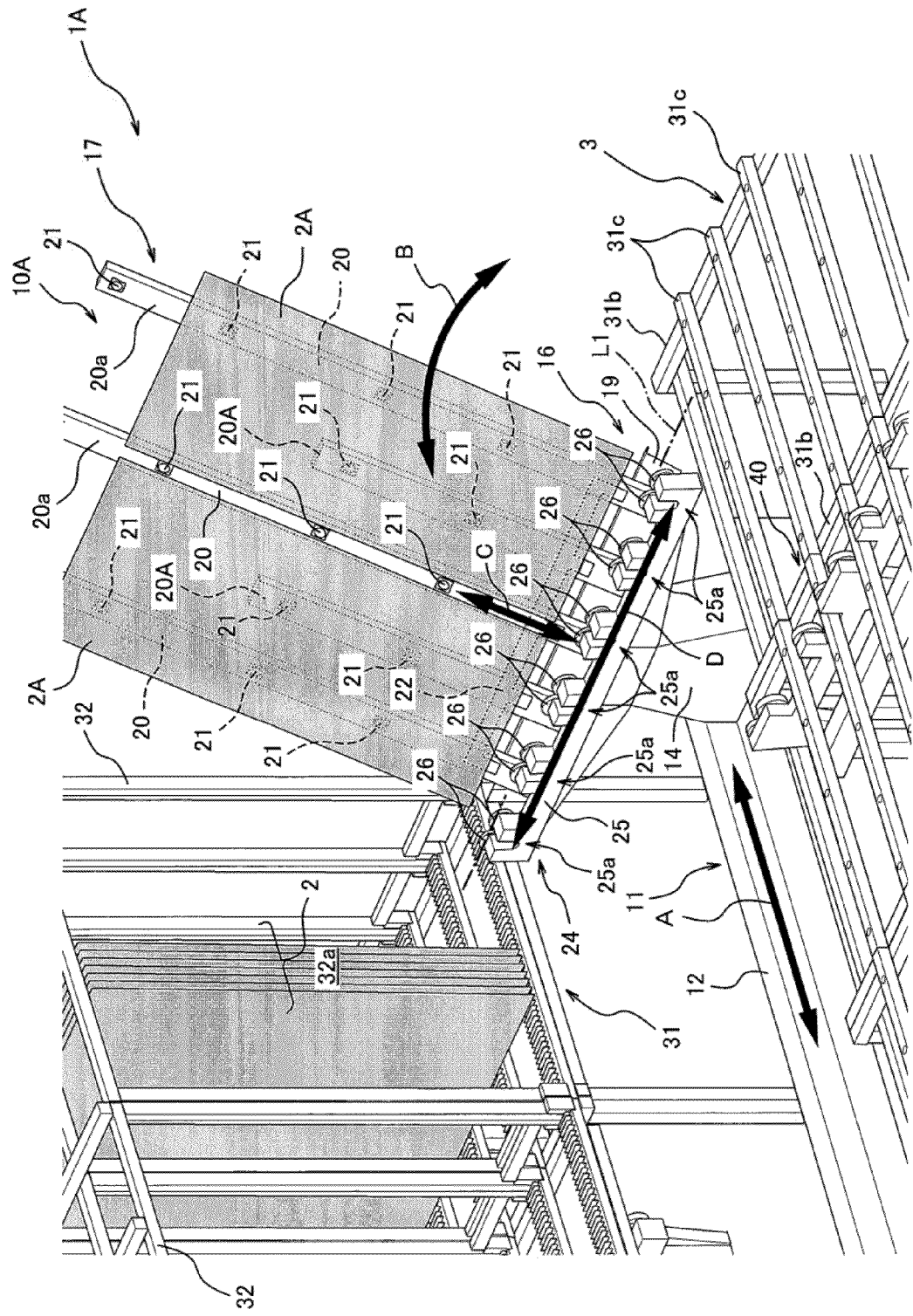
FIG. 23 is an enlarged perspective view showing part of a stocker facility according to Embodiment 2.
Figure 24:
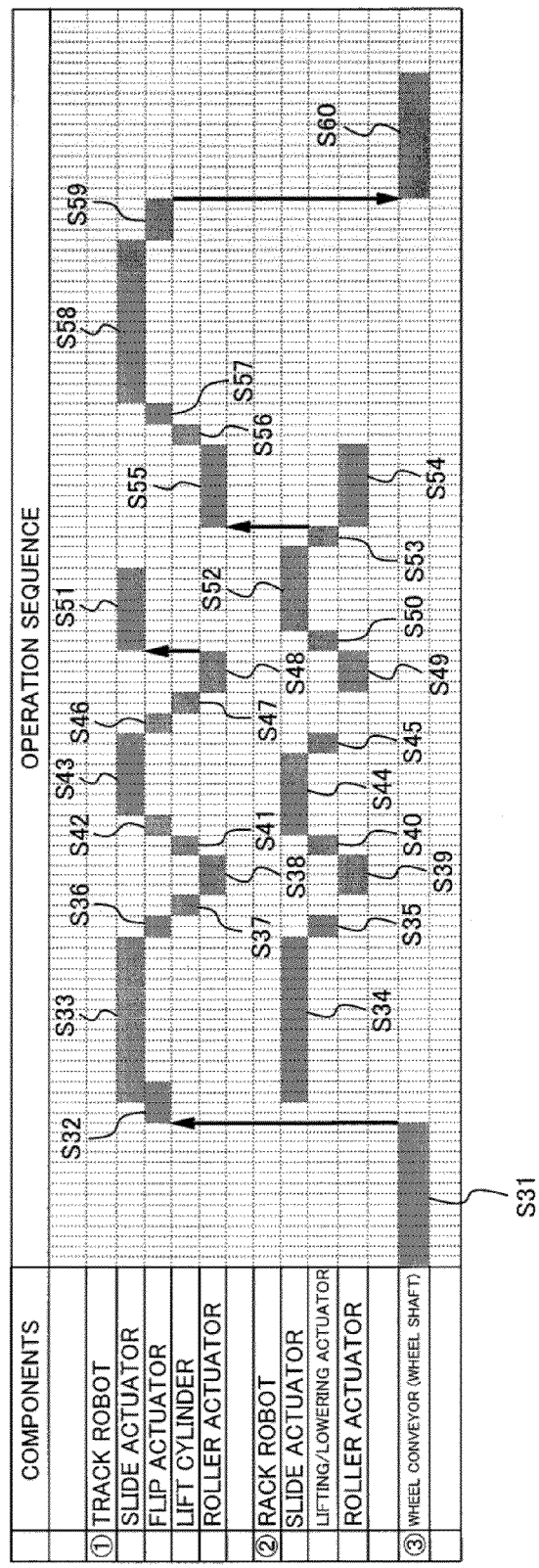
FIG. 24 is an operation sequence diagram showing control steps that are performed by the stocker facility shown in FIG. 23 at the time of carrying-in and carrying-out of glass plates.
Figure 25:
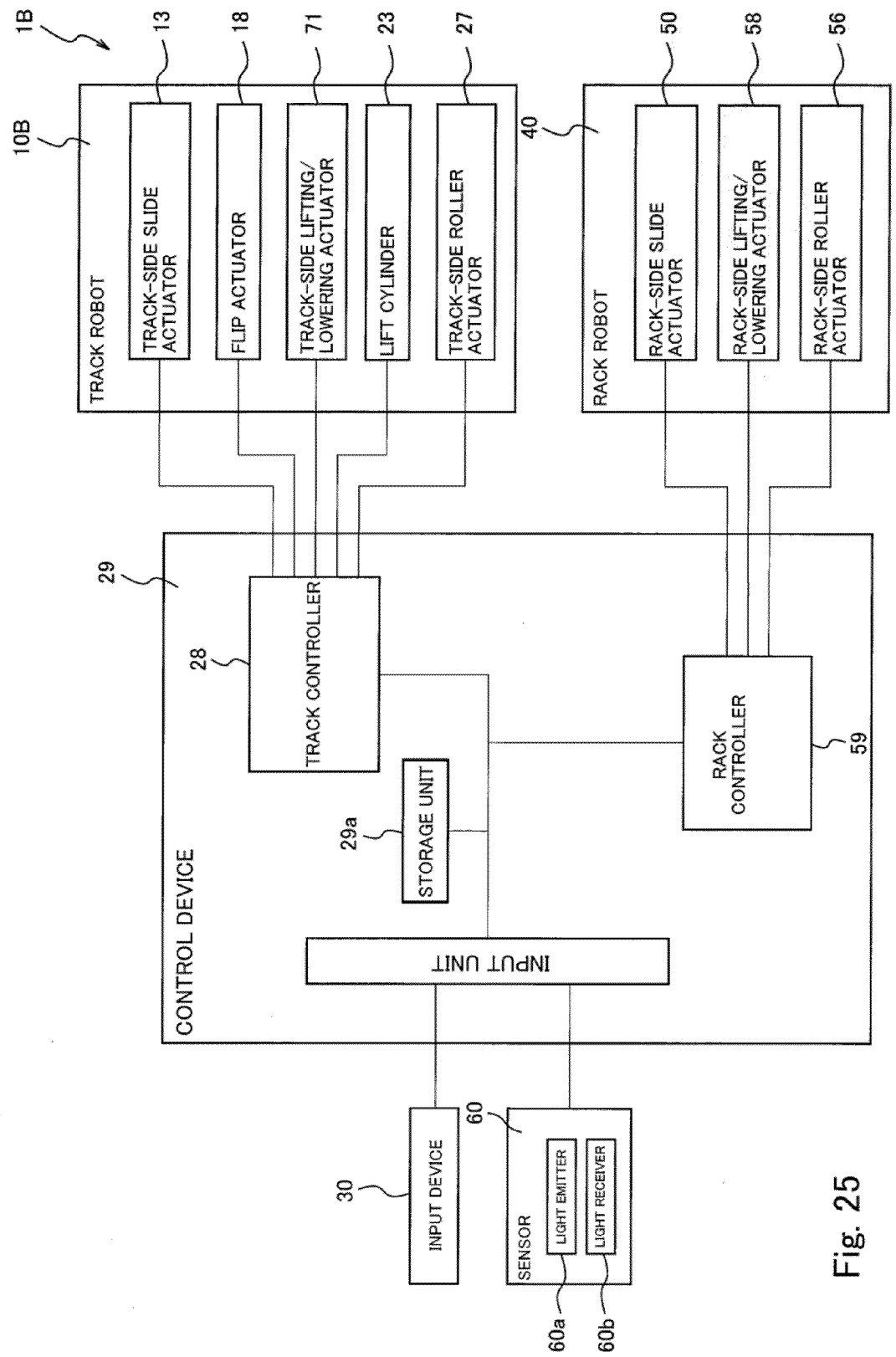
FIG. 25 is a block diagram showing a control system configuration of a stocker facility according to Embodiment 3.

A track robot 10A of the stocker facility 1A according to Embodiment 2 includes auxiliary plates 20A, each of which is provided between two adjacent support plates 20. The auxiliary plates 20A are formed to be shorter than the support plates 20. Except the difference in length, the auxiliary plates 20A are configured in the same manner as the support plates 20. Each auxiliary plate 20A has a plurality of spherical rollers 21 at its front surface. Installation of the auxiliary plates 20A makes it possible not only to place a large-sized glass plate 2 shown in Embodiment 1 on the flip 17 but also to place two half-sized glass plates 2A (see FIG. 23), or two quarter-sized glass plates (not shown), on the flip 17 at one time and store the two glass plates 2A or the two quarter-sized glass plates into different respective racks 32. The width of the half-sized glass plate 2A is halved from the width of the glass plate 2, and the width and height of the quarter-sized glass plate are halved from the width and height of the glass plate 2. Hereinafter, a description is given with reference to an operation sequence diagram in FIG. 24 regarding a case where two glass plates 2A placed on the flip 17 are stored into different respective racks 32 and also two glass plates 2A are retrieved from another rack 32 at one time. It should be noted that since the details in the columns of the operation sequence diagram in FIG. 24 are the same as in FIG. 12, a description thereof is omitted.

<Glass Plate Storing Operation>

First, the track controller 28 and the rack controller 59 perform the same control as the control that the stocker facility 1 according to Embodiment 1 performs in steps S1 to S9. Specifically, two glass plates 2A moving on the wheel conveyor 3 are stopped by the stoppers 6 (step S31); the track controller 28 causes the flip 17 to rotate and rise forward, so that the two glass plates 2A are placed on the flip 17 (step S32); and then the track controller 28 causes the track-side running base 14 to move to a storage position while causing the flip 17 to rise further until the inclination angle of the flip 17 becomes the angle α (step S33).

Meanwhile, in parallel to the control by the track controller 28, the rack controller 59 causes the rack-side conveyance base 54 to slide to the storage position (step S34); after the rack-side conveyance base 54 has reached the storage position, the rack controller 59 further causes the rack-side conveyance base 54 to be lifted to the conveyance position (step S35); when the track-side conveyance base 25 has reached the front of the storage position and the rack-side conveyance base 54 has been lifted to the conveyance position, the sensor 60 transmits to the control device 29 a signal indicating that the bases 25 and 54 are aligned with each other. In response, the track controller 28 causes the flip 17 to rise again until the inclination angle of the flip 17 becomes the angle β (step S36). When the inclination angle of the flip 17 becomes the angle β, the track controller 28 causes the support 22 to be lowered, so that the glass plates 2A are placed on the rollers 26 of the track-side conveyance base 25 (step S37). Then, the track controller 28 causes the rollers 26 to rotate (step S38). The rack controller 59 also causes the rollers 55 of the rack-side conveyance base 54 to rotate in synchronization with the rollers 26 (step S39). As a result, one glass plate 2A is transferred from the flip 17 to the rack 32.

When the one glass plate 2A is transferred to the rack 32 and entirely placed on the upper surfaces of the rollers 55 of the rack-side conveyance base 54, the rack controller 59 drives the rack-side lifting/lowering actuator 58 to lower the rack-side conveyance base 54, so that the one glass plate 2A is placed on the bottom girders 33a (step S40), and thus the operation of storing the one glass plate 2A is completed. It should be noted that after the storing operation is completed, the rack controller 59 causes the rack-side conveyance base 54 to be lowered to the standby position, and prepares for the next retrieval or carrying-in of a glass plate 2A.

After the one glass plate 2A is transferred, the track controller 28 drives the lift cylinder 23 to lift the support 22, with the other glass plate 2A placed on the upper surfaces of the rollers 26 of the track-side conveyance base 25, thereby lifting the other glass plate 2A from the rollers 26 (step S41). After the other glass plate 2A is lifted from the rollers 26, the track controller 28 subsequently drives the flip actuator 18 to rotate the flip 17 until the inclination angle of the flip 17 becomes the angle α (step S42). When the inclination angle of the flip 17 becomes the angle α, the track controller 28 drives the track-side slide actuator 13 to move the track-side conveyance base 25 to the front of another storage position (step S43).

Then, the rack controller 59 drives the rack-side slide actuator 50 to move the rack-side conveyance base 54 to the other storage position (step S44). When the rack-side conveyance base 54 reaches the other storage position, the rack controller 59 drives the rack-side lifting/lowering actuator 58 to lift the rack-side conveyance base 54 to the conveyance position (step S45). When the track-side conveyance base 25 has reached the front of the other storage position and the rack-side conveyance base 54 has been lifted to the conveyance position, the sensor 60 transmits to the control device 29 a signal indicating that the bases 25 and 54 are aligned with each other. In response, the track controller 28 drives the flip actuator 18 to rotate the flip 17 again until the inclination angle of the flip 17 becomes the angle β (step S46).

When the inclination angle of the flip 17 becomes the angle β, the track controller 28 causes the support 22 to be lowered, so that the other glass plate 2A is placed on the rollers 26 of the track-side conveyance base 25 (step S47). Then, the track controller 28 causes the rollers 26 to rotate (step S48). The rack controller 59 also causes the rollers 55 of the rack-side conveyance base 54 to rotate in synchronization with the rollers 26 (step S49). As a result, the other glass plate 2A is transferred from the flip 17 to the rack 32. When the other glass plate 2A is transferred to the rack 32 and entirely placed on the upper surfaces of the rollers 55 of the rack-side conveyance base 54, the rack controller 59 drives the rack-side lifting/lowering actuator 58 to lower the rack-side conveyance base 54, so that the other glass plate 2A is placed on the bottom girders 33a (step S50). It should be noted that after the storing operation is completed, the rack controller 59 causes the rack-side conveyance base 54 to be lowered to the standby position, and prepares for the next retrieval or carrying-in of a glass plate 2A.

<Glass Plate Retrieval Operation>

While the rack-side conveyance base 54 is being lowered, the track controller 28 drives the track-side slide actuator 13 to move the track-side conveyance base 25 to a storage position at which two glass plates 2A are stored side by side in the left-right direction (step S51). After the rack-side conveyance base 54 has been lowered to the standby position, the rack controller 59 drives the rack-side slide actuator 50 to move the rack-side conveyance base 54 to the storage position in parallel to the control by the track controller 28 (step S52). Subsequently, the rack controller 59 drives the rack-side lifting/lowering actuator 58 to lift the rack-side conveyance base 54 to the conveyance position, so that the glass plates 2A are placed on the upper surfaces of the rollers 55 (step S53).

When the rack-side conveyance base 54 reaches the conveyance position, the rack-side conveyance base 54 and the track-side conveyance base 25 become aligned in the left-right direction, and the sensor 60 transmits to the control device 29 a signal indicating that the bases 25 and 54 are aligned with each other. Upon receiving the signal, the control device 29 determines that the rollers 26 and 55 are aligned with each other, and the rack controller 59 drives the rack-side roller actuator 56 to rotate the rollers 55 (step S54). The track controller 28 also causes the rollers 26 of the track-side conveyance base 25 to rotate in synchronization with the rollers 55 (step S55). As a result, the two glass plates 2A are transferred from the rack 32 to the flip 17.

When the two glass plates 2A are transferred to the flip 17 and entirely placed on the track-side conveyance base 25, the track controller 28 performs the same control as the control that the stocker facility 1 according to Embodiment 1 performs in steps S16 to S21. Specifically, the track controller 28 causes the support 22 to be lifted slowly, so that the two glass plates 2A are removed upward from the rollers 26 (step S56), and causes the flip 17 to be inclined backward until the inclination angle becomes the angle α (step S57). After the inclination angle of the flip 17 becomes the angle α, the track controller 28 causes the track-side conveyance base 25 to move to the vicinity of the wheel conveyor 3 (step S58), and causes the flip 17 to be further inclined until the flip 17 becomes laid down in the horizontal orientation, so that the two glass plates 2A are placed on the wheel conveyor 3. When the two glass plates 2A are placed on the wheel conveyor 3, the controller for the conveyor causes the protruding stoppers 6 to withdraw and drives the wheel shafts 5 to move the glass plates 2A to the downstream side. Then, the operation sequence returns to step S1 or step S31 in order to store the next glass plate 2 or glass plates 2A moving from the upstream side into the corresponding rack 32, and thus repeats carrying-in and carrying-out of glass plates 2 and 2A.

As described above, the stocker facility 1A according to the present embodiment is capable of placing two glass plates 2A on the flip 17 at one time, and storing the glass plates 2A into different respective racks 32. The stocker facility 1A is also capable of carrying out of a rack 32 at one time two glass plates 2A that are stored side by side at one storage position in the rack 32. Therefore, the time for carrying-in and carrying-out of the glass plates 2A can be reduced.

Further, in the stocker facility 1 according to the present embodiment, a glass plate 2A stored in a rack 32 can be moved in the left-right direction by means of the rack robot 40 for repositioning. Accordingly, in a case where a glass plate 2A is stored at one storage position in advance and another glass plate 2A is to be additionally stored at the same storage position, the glass plate 2A stored in advance can be moved to the left and right to adjust its position prior to the storing of the other glass plate 2A, and as a result, the other glass plate 2A can be additionally stored at the storage position such that the two glass plates 2A are arranged side by side in the left-right direction. In this manner, the position of a glass plate 2A in the left-right direction can be re-adjusted. For this reason, at the time of storing a glass plate 2A into a rack 32, it is not necessary to precisely position the glass plate 2A in the rack 32. Therefore, the control for storing two glass plates 2A side by side at one storage position can be readily performed.

In addition, the stocker facility 1A provides the same operational advantages as those provided by the stocker facility 1 according to Embodiment 1.

In the stocker facilities 1 and 1A according to Embodiments 1 and 2 having the above configurations, the number of components forming the rack robot 40 is less than the number of components forming the track robot 10. Therefore, the rack robot 40 can be moved more speedily than the track robot 10. Moreover, the rack robot 40 can operate independently of the track robot 10. Therefore, after a glass plate 2 is transferred from the track robot 10 to the rack robot 40, the track robot 10 may be moved toward the next carry-out position before the rack robot 40 is moved toward the next carry-out position. In this manner, the time for carrying-out of a glass plate 2 or 2A can be reduced. Described below is Embodiment 3 capable of further reducing the carrying-out time compared to the stocker facility 1A.

Embodiment 3

Figure 26:
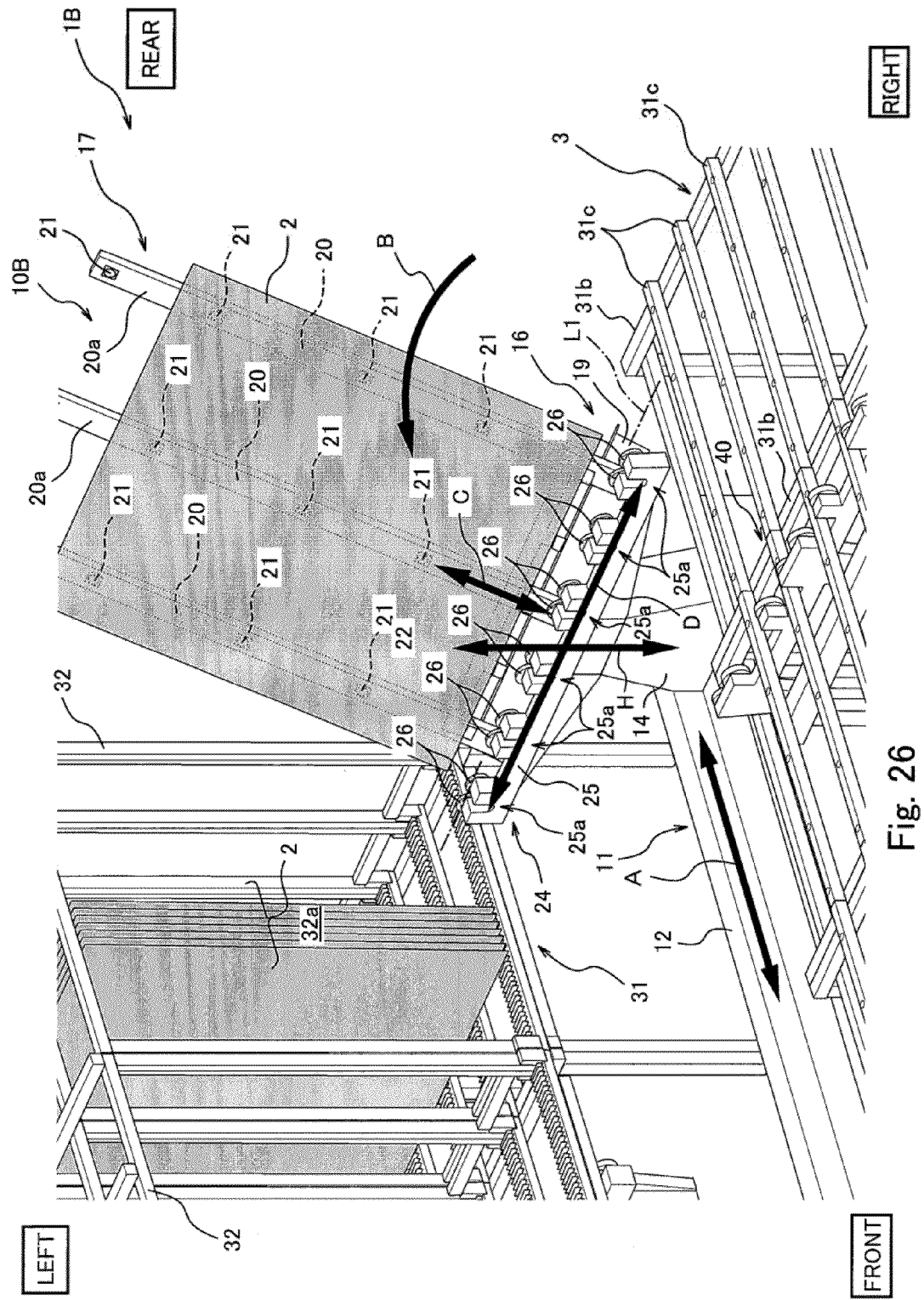
FIG. 26 is an enlarged perspective view showing part of the stocker facility shown in FIG. 25.

In a stocker facility 1B according to Embodiment 3, a track robot 10B further includes a lifting/lowering mechanism. The track-side conveyance base 25 is attached to the front of the track-side running base 14 via the track-side lifting/lowering mechanism. The track-side lifting/lowering mechanism includes a track-side lifting/lowering actuator 71. For example, the track-side lifting/lowering actuator 71 is an air pressure cylinder configured to lift and lower the track-side conveyance base 25 in the up-down direction (see arrow H in FIG. 26).

At the time of carrying-in and carrying-out of glass plates 2 and 2A, the stocker facility 1B controls the operations of the track robot 10B and the rack robot 40 by following substantially the same steps as the control steps shown in FIG. 12 and FIG. 24. Hereinafter, differences from the control steps shown in FIG. 12 and FIG. 24 are only described.

In the stocker facility 1B, when a glass plate 2 or 2A is sent from the track-side conveyance base 25 to the rack-side conveyance base 54 (e.g., steps S8 and S9, steps S38 and S39, or steps S48 and S49) and at least half of the glass plate 2 or 2A has been moved onto the rack-side conveyance base 54, the track-side lifting/lowering actuator 71 is driven to lower the track-side conveyance base 25. As a result, the track-side conveyance base 25 is removed from the glass plate 2 or 2A. After the track-side conveyance base 25 is removed from the glass plate 2 or 2A, the track controller 28 drives the track-side slide actuator 13 to move the track-side conveyance base 25 toward the front of the next storage position before the rack-side conveyance base 54 is moved toward the front of the next storage position. In this manner, the track-side conveyance base 25, which moves slower than the rack-side conveyance base 54, may be moved before moving the rack-side conveyance base 54, and thereby the time for carrying-out of a glass plate 2 or 2A can be reduced significantly.

In addition, the stocker facility 1B according to Embodiment 3 provides the same operational advantages as those provided by the stocker facility 1 according to Embodiment 1.

Embodiment 4

Figure 27:
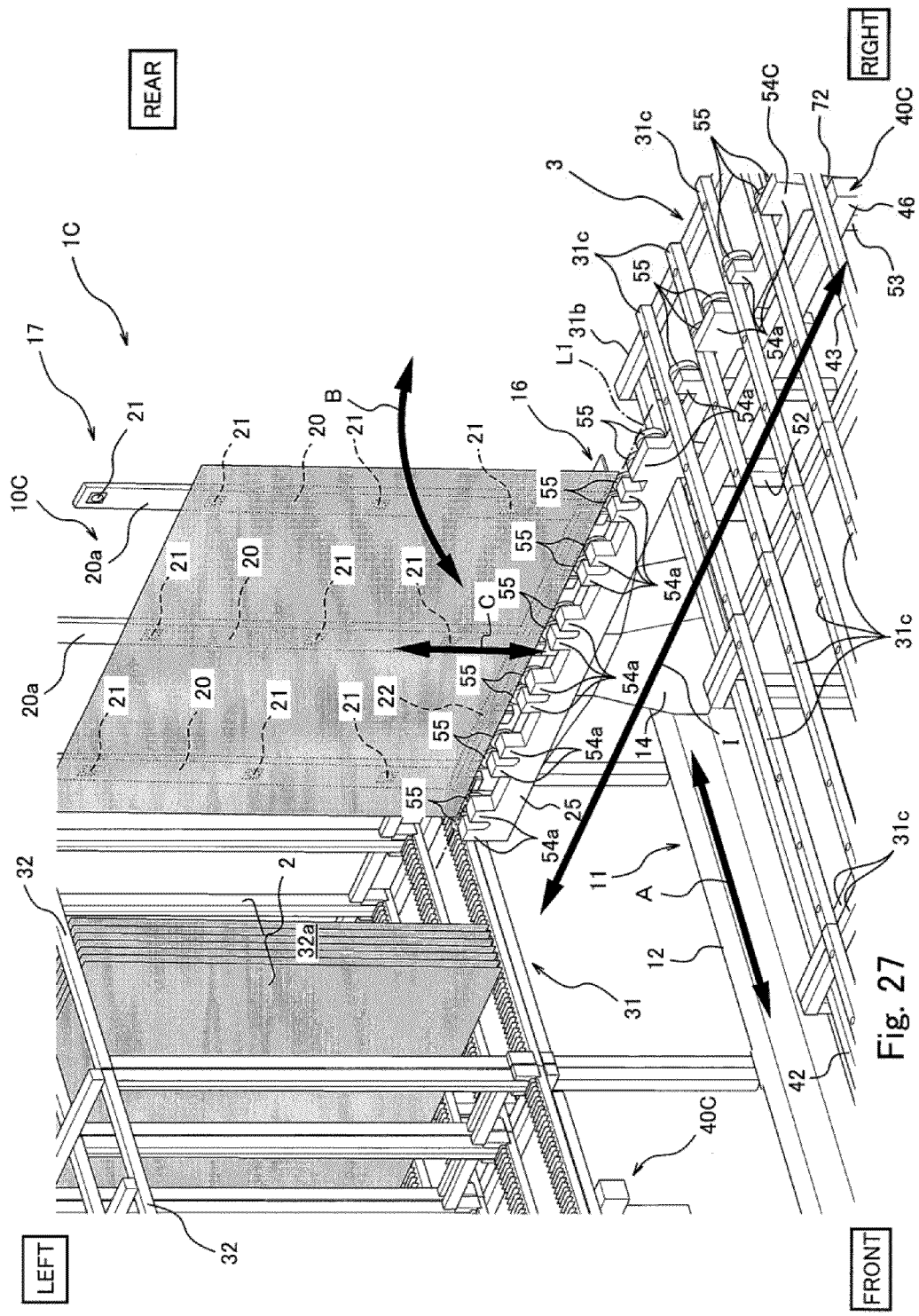
FIG. 27 is an enlarged perspective view showing part of a stocker facility according to Embodiment 4.
Figure 28:
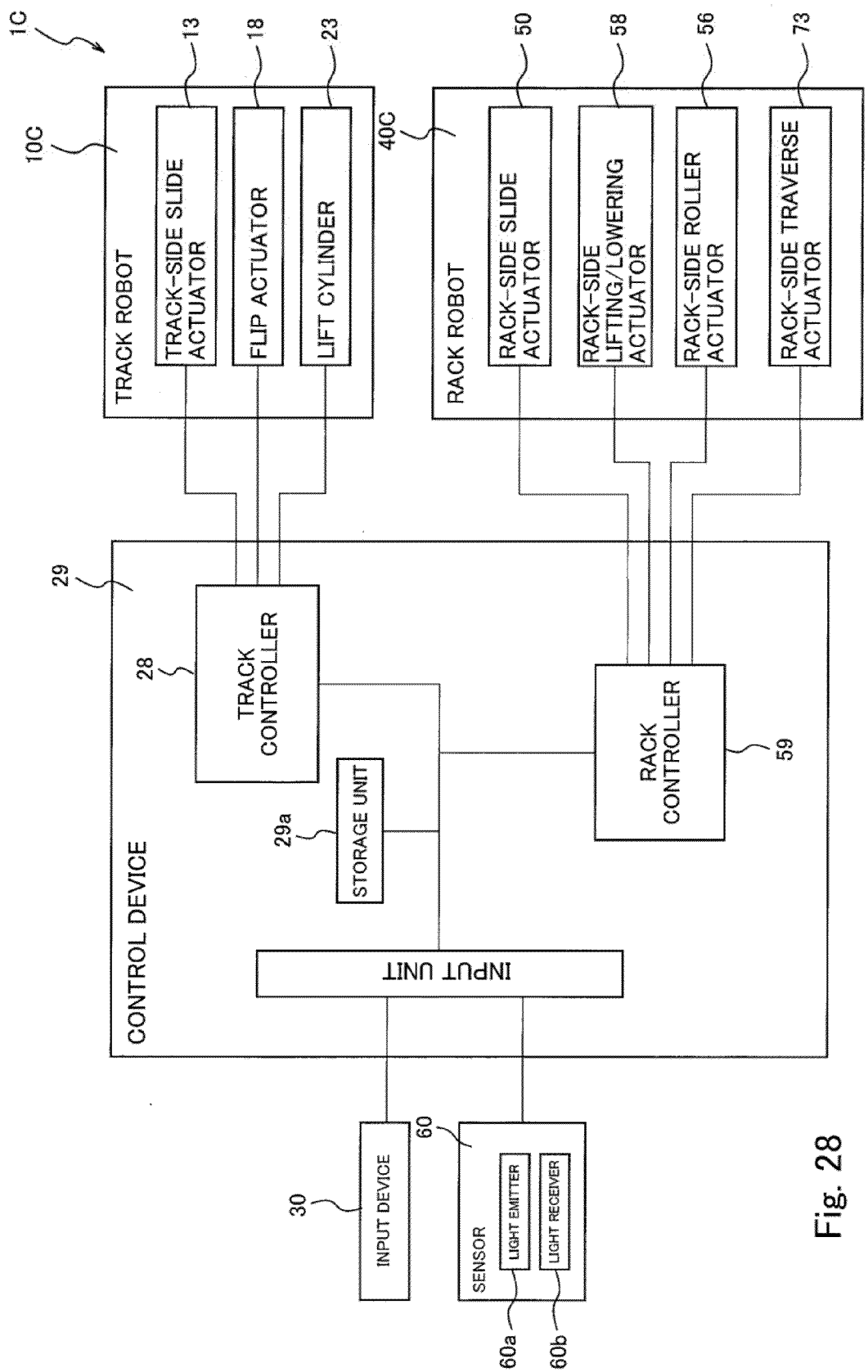
FIG. 28 is a block diagram showing a control system configuration of the stocker facility shown in FIG. 27.
Figure 29:
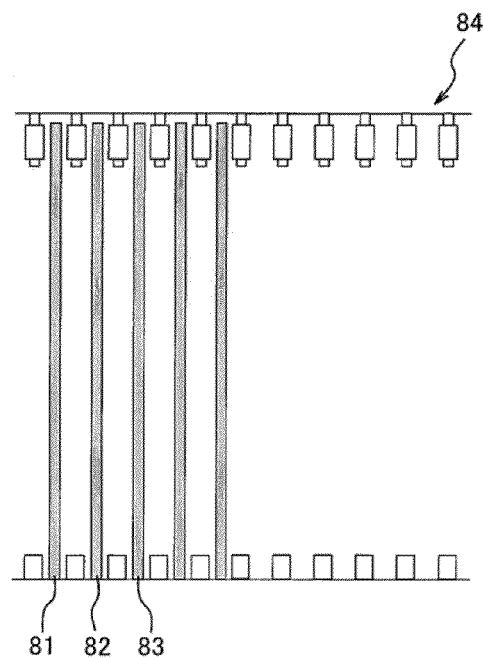
FIG. 29 is a front view of a rack capable of storing a plurality of substrates.
Figure 30:
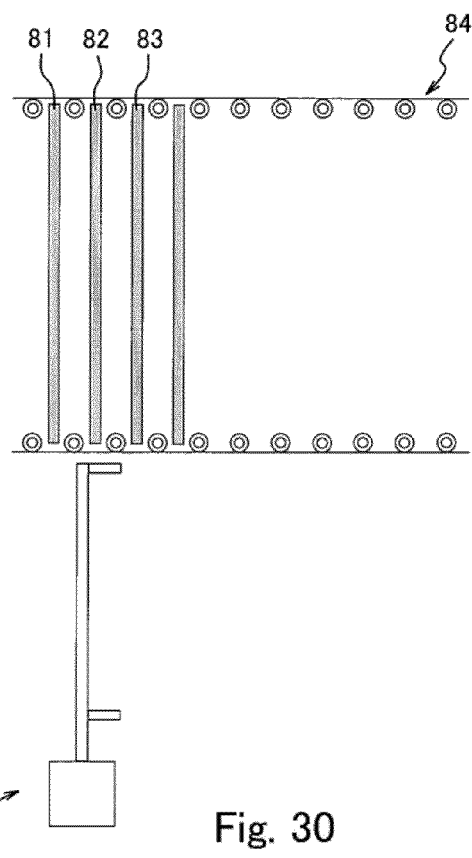
FIG. 30 is a plan view of the rack shown in FIG. 29 and an end effector, which are seen from above.

In a stocker facility 1C according to Embodiment 4, a track robot 10C does not include the track-side conveyance base 25, but instead, each rack robot 40C includes a rack-side traverse mechanism 72. The rack-side traverse mechanism 72 is provided at the rack-side running base 46, and includes a rack-side traverse actuator 73 which is configured as, for example, a ball screw mechanism. In the rack-side conveyance mechanism 51, a rack-side conveyance base 54C is attached to the rack-side running base 46 via the rack-side traverse mechanism 72. The rack-side traverse actuator 73 is configured to cause the rack-side conveyance base 54C located at the standby position to move laterally in the left-right direction (see arrow I in FIG. 27). The rack-side conveyance base 54C extends laterally such that, when moved laterally, the rack-side conveyance base 54C spans between the track robot 10C side including the flip 17 and the rack 32 side (see FIG. 27).

In the stocker facility 1C having the above configuration, when the rack-side running base 46 has been moved to a storage position and the flip 17 has been moved to the front of the storage position, the rack controller 59 causes the rack-side traverse actuator 73 to move the rack-side conveyance base 54C laterally to a position below the support 22 of the flip 17, and also causes the rack-side lifting/lowering actuator 58 to lift the rack-side conveyance base 54C. After the rack-side conveyance base 54C is lifted, the track controller 28 causes the lift cylinder 23 to lower the support 22, so that the glass plate 2 is placed on the upper surfaces of the rollers 55 of the rack-side conveyance base 54C.

In this state, when the rack-side roller actuator 56 is driven, the glass plate 2 leaning against the flip 17 is sent into the rack 32. When the glass plate 2 is entirely stored in the rack 32, the rack-side conveyance base 54C is lowered by means of the rack-side lifting/lowering actuator 58. As a result, the glass plate 2 is inserted between two adjacent separators 34 and then placed on the bottom girders 33a. In this manner, the glass plate 2 is stored in the rack 32.

The stocker facility 1C having the above configuration makes it possible to reduce the number of components included in the track robot 10C, thereby making it possible to reduce the weight of the track robot 10C. As a result, the movement of the track robot 10C can be made faster, and the time for carrying-in and carrying-out of glass plates 2 can be reduced.

In addition, the stocker facility 1C according to Embodiment 4 provides the same operational advantages as those provided by the stocker facility 1 according to Embodiment 1.

Other Embodiments

In the above embodiments, when the track-side running base 14 is moved, the glass plate 2 is simply supported by the support plates 20. However, as an alternative, the support plates 20 may be provided with a suction mechanism which is configured to be adhered to the glass plate 2 by suction. As another alternative configuration, not a suction mechanism but a chuck or the like may be provided, and the flip 17 may be caused to hold the glass plate 2 via the chuck or the like only when the track-side running base 14 is moved.

Further, in the above embodiments, the inclination angle of the flip 17 when the track-side running base 14 is moved is set to the angle $\alpha$. However, the inclination angle of the flip 17 when the track-side running base 14 is moved is not necessarily set to such an angle, but may be set to the angle $\beta$. In this case, the control device 29 may control the operation of the sliding apparatus 11 to reduce the moving speed of the track-side running base 14. In such a manner, the amount of wind caused by the glass plate 2 can be reduced.

As described above, the rollers 26 may be replaced by, for example, a belt mechanism so long as such a replacing configuration allows a glass plate 2 to slidingly move to the left or right. Further, in the present embodiment, the track-side running base 14 is slidingly moved after the flip 17 is raised or lowered to adjust the inclination angle to the angle $\alpha$. However, such a raising or lowering operation is not essential when the track-side running base 14 is slidingly moved. The track-side running base 14 may be slidingly moved with the flip 17 kept laid down, and after the track-side running base 14 has reached the front of a storage position, the flip 17 may be raised such that the inclination angle becomes the angle $\beta$.

Moreover, after the flip 17 has received a stored glass plate 2, the track-side running base 14 may be slidingly moved with the inclination angle of the flip 17 kept at the angle $\beta$.

Although each rack 32 is provided with the guide rollers 35, such guiding components need not be rollers but may alternatively be, for example, components similar to the separators 34, so long as the alternative components allow two adjacent stored glass plates 2 to be spaced apart from each other. In addition, the shape of the rack 32 is not limited to the above-described shape, but may be a different shape.

In the above embodiments, the track-side conveyance mechanism 24 is provided between two racks 32. However, the position of the track-side conveyance mechanism 24 is not limited to such a position. As an alternative example, the track-side conveyance mechanism 24 may be provided below the racks 32. In such a case, a different moving apparatus having the same configuration as that of the track-side running base 14 is provided below the racks 32, and the track-side conveyance mechanism 24 is configured to be movable in the front-rear direction by means of the moving apparatus. In this case, the track-side running base 14 and the moving apparatus form a moving mechanism. In the stocker facility thus configured, the track-side conveyance base 25 of the track-side conveyance mechanism 24 slidingly moves from below a rack 32 to the flip 17, and the transfer between the rack 32 and the flip 17 can be performed by means of the track-side conveyance base 25.

From the foregoing description, numerous modifications and other embodiments of the present invention are obvious to one skilled in the art. Therefore, the foregoing description should be interpreted only as an example and is provided for the purpose of teaching the best mode for carrying out the present invention to one skilled in the art. The structural and/or functional details may be substantially altered without departing from the spirit of the present invention.

INDUSTRIAL APPLICABILITY

The present invention is applicable to a stocker facility including racks and a plate-shaped member transfer mechanism, in which the racks are each capable of storing a plurality of plate-shaped members such that the stored plate-shaped members are arranged in a raised state, and the plate-shaped member transfer mechanism is configured to insert the plate-shaped members into the racks and to retrieve the plate-shaped members from the racks.

REFERENCE SIGNS LIST 1A to 1C stocker facility
2, 2A glass plate
10, 10A to 10C track robot
11 sliding apparatus
16 flip rotation mechanism
17 flip
21 spherical roller
22 support
24 track-side conveyance mechanism
26 roller
32 rack
33a bottom girder
40, 40C rack robot
41 rack-side moving mechanism
51 rack-side conveyance mechanism
55 roller
60 sensor

The invention claimed is:

1. A plate-shaped member transfer facility comprising:
a rack configured to store a plurality of plate-shaped members, which are supported by a support so as to be raised and extend in a conveying direction, such that the plurality of plate-shaped members stored in the rack are arranged in an arrangement direction crossing the conveying direction, the rack being configured to allow each of the plurality of plate-shaped members to be carried into and out of the rack in the conveying direction through an insertion opening; and
a plate-shaped member transfer mechanism configured to carry each plate-shaped member into or out of the rack in the conveying direction through the insertion opening, wherein
the plate-shaped member transfer mechanism includes:
a flip rotation mechanism positioned in track-side space facing the insertion opening of the rack, the flip rotation mechanism including a flip configured to support the plate-shaped member and be rotatable around a rotation axis parallel to the conveying direction, the flip rotation mechanism being configured to both rotate the flip such that the plate-shaped member on a conveyor is placed on the flip and raised, and rotate the flip such that the plate-shaped member on the flip is laid down and placed on the conveyor;
a conveyance mechanism extending in the conveying direction and including a sender configured to send, in the conveying direction, the plate-shaped member that has been raised by the flip rotation mechanism; and
a moving mechanism configured to move the flip rotation mechanism and the conveyance mechanism in the arrangement direction,
the conveyor is a wheel conveyor formed by a plurality of wheel shafts,
the flip is configured to come between the wheel shafts when the plate-shaped member on the conveyor is placed on the flip or when the plate-shaped member on the flip is laid down and placed on the conveyor,
the flip rotation mechanism is configured to lay down the flip such that the flip becomes flush with or positioned lower than the wheel shafts when the plate-shaped member on the conveyor is placed on the flip or when the plate-shaped member on the flip is laid down and placed on the conveyor, and
the conveyance mechanism is configured to transfer the plate-shaped member in the raised state between the track-side space and the rack by means of the sender.

2. The plate-shaped member transfer facility according to claim 1, wherein
the conveyance mechanism includes: a track-side sending part serving as the sender; a track-side conveyance mechanism disposed in the track-side space; a rack-side sending part serving as the sender; and a rack-side conveyance mechanism disposed at the rack.

3. The plate-shaped member transfer facility according to claim 2, wherein
the track-side conveyance mechanism and the rack-side conveyance mechanism are configured to transfer the plate-shaped member in the raised state between the track-side sending part and the rack-side sending part.

4. The plate-shaped member transfer facility according to claim 2, wherein
the moving mechanism includes: a track-side moving mechanism configured to move the track-side conveyance mechanism in the arrangement direction; and a rack-side moving mechanism configured to move the rack-side conveyance mechanism in the arrangement direction.

5. The plate-shaped member transfer facility according to claim 2, wherein
the track-side moving mechanism is configured to move the track-side conveyance mechanism and the flip rotation mechanism together in the arrangement direction.

6. The plate-shaped member transfer facility according to claim 2, wherein
the rack includes a plurality of support members,
the plurality of support members are arranged to be spaced apart from each other in the conveying direction, and are configured to support the plate-shaped member at upper surfaces of the respective support members,
the rack-side sending part includes a rack-side driving member configured to send the plate-shaped member by moving the plate-shaped member on a face of the rack-side sending part, and
the rack-side conveyance mechanism is configured to lift and lower the rack-side sending part between a rack-side conveyance position and a rack-side standby position, the rack-side conveyance position being a position at which the face of the rack-side sending part is positioned higher than the upper surfaces of the support members, the rack-side standby position being a position at which the face of the rack-side sending part is positioned lower than the upper surfaces of the support members.

7. The plate-shaped member transfer facility according to claim 6, wherein
the track-side sending part includes a track-side driving member configured to send the plate-shaped member by moving the plate-shaped member on a face of the track-side sending part, and
the track-side conveyance mechanism is configured to lift and lower the track-side sending part between a track-side conveyance position and a standby position, the track-side conveyance position being a position at which the face of the track-side sending part is positioned at a height that is substantially the same as a height of the face of the rack-side sending part when the rack-side sending part is at the rack-side conveyance position, the standby position being a position at which the face of the track-side sending part is positioned lower than the upper surfaces of the support members.

8. The plate-shaped member transfer facility according to claim 2, further comprising a position detection sensor configured to detect whether the track-side sending part and the rack-side sending part are aligned in the conveying direction, wherein
the track-side sending part and the rack-side sending part are configured to perform transfer of the plate-shaped member when the position detection sensor detects that the track-side sending part and the rack-side sending part are aligned in the conveying direction.

9. The plate-shaped member transfer facility according to claim 1, wherein
the flip rotation mechanism is configured to rotate the flip to lay down the plate-shaped member supported by the flip when the flip rotation mechanism is moved by the moving mechanism.

10. The plate-shaped member transfer facility according to claim 1, wherein the flip includes a plurality of rollable spherical rollers, and is configured to support a rear surface of the plate-shaped member by means of the plurality of spherical rollers.

11. A plate-shaped member transfer facility comprising:
a rack configured to store a plurality of plate-shaped members, which are supported by a support so as to be raised and extend in a conveying direction, such that the plurality of plate-shaped members stored in the rack are arranged in an arrangement direction crossing the conveying direction, the rack being configured to allow each of the plurality of plate-shaped members to be carried into and out of the rack in the conveying direction through an insertion opening; and
a plate-shaped member transfer mechanism configured to carry each plate-shaped member into or out of the rack in the conveying direction through the insertion opening, wherein
the plate-shaped member transfer mechanism includes:
   a flip rotation mechanism positioned in track-side space facing the insertion opening of the rack, the flip rotation mechanism including a flip configured to support the plate-shaped member and be rotatable around a rotation axis parallel to the conveying direction, the flip rotation mechanism being configured to rotate the flip such that the plate-shaped member on a conveyor is placed on the flip and raised, or rotate the flip such that the plate-shaped member on the flip is laid down and placed on the conveyor;
   a conveyance mechanism extending in the conveying direction and including a sender configured to send, in the conveying direction, the plate-shaped member that has been raised by the flip rotation mechanism;
   a moving mechanism configured to move the flip rotation mechanism and the conveyance mechanism in the arrangement direction; and
   a position detection sensor configured to detect whether a track-side sending part and a rack-side sending part are aligned in the conveying direction,
the conveyance mechanism includes: the track-side sending part serving as the sender; a track-side conveyance mechanism disposed in the track-side space; the rack-side sending part serving as the sender; and a rack-side conveyance mechanism disposed at the rack, and
the track-side sending part and the rack-side sending part are configured to perform transfer of the plate-shaped member between the track-side space and the rack when the position detection sensor detects that the track-side sending part and the rack-side sending part are aligned in the conveying direction.

* * * * *